United States Patent
Yang et al.

(10) Patent No.: US 10,777,137 B2
(45) Date of Patent: Sep. 15, 2020

(54) PIXEL AND DISPLAY DEVICE INCLUDING THE SAME

(71) Applicant: Samsung Display Co., Ltd., Yongin-si (KR)

(72) Inventors: Tae Hoon Yang, Yongin-si (KR); Ki Bum Kim, Yongin-si (KR); Jong Chan Lee, Yongin-si (KR); Woong Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/372,296

(22) Filed: Apr. 1, 2019

(65) Prior Publication Data

US 2019/0311675 A1    Oct. 10, 2019

(30) Foreign Application Priority Data

Apr. 10, 2018 (KR) .................... 10-2018-0041747

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3283* (2013.01);
(Continued)

(58) Field of Classification Search
CPC .. G09G 3/3233; G09G 3/3266; G09G 3/3283; G09G 2300/0426;
(Continued)

(56) References Cited

U.S. PATENT DOCUMENTS 10,453,908 B2 * 10/2019 Park .................... H01L 27/3262
2015/0049126 A1    2/2015 Jung
(Continued)

FOREIGN PATENT DOCUMENTS

KR    10-2015-0019592    2/2015
KR    10-2017-0119270    10/2017
(Continued)

*Primary Examiner* — Wing H Chow
(74) *Attorney, Agent, or Firm* — H.C. Park & Associates, PLC

(57) ABSTRACT

A pixel including a light emitting element, a first transistor connected between a first node and the light emitting element to control current flowing from a first power supply to a second power supply, a second transistor connected between a data line and the first transistor to be turned on by an $i^{th}$ first scan signal, a third transistor including a P-type TFT connected between the first transistor and the first node to be turned on by the $i^{th}$ first scan signal and, a fourth transistor including an N-type TFT connected between the first node and an initialization power supply line to be turned on by an $i-1^{th}$ scan signal, and a first connection line connected between the third and fourth transistors to electrically connect semiconductor patterns thereof, in which the first connection line is disposed on the third and fourth transistors and contacts the semiconductor patterns thereof.

30 Claims, 16 Drawing Sheets

(51) Int. Cl.
  *G09G 3/3283* (2016.01)
  *H01L 27/32* (2006.01)
(52) U.S. Cl.
  CPC . *H01L 27/3276* (2013.01); *G09G 2300/0426* (2013.01); *G09G 2300/0439* (2013.01); *G09G 2300/0809* (2013.01)
(58) Field of Classification Search
  CPC .... G09G 2300/0439; G09G 2300/0809; H01L 27/3276
  See application file for complete search history.

(56) References Cited

U.S. PATENT DOCUMENTS

| | | |
|---|---|---|
| 2017/0301280 A1 | 10/2017 | Ka et al. |
| 2018/0006099 A1 | 1/2018 | Ka et al. |
| 2019/0180688 A1 | 6/2019 | Yang et al. |

FOREIGN PATENT DOCUMENTS

| | | |
|---|---|---|
| KR | 10-2018-0004369 | 1/2018 |
| KR | 10-2019-0067956 | 6/2019 |

\* cited by examiner

PIXEL AND DISPLAY DEVICE INCLUDING THE SAME

CROSS-REFERENCE TO RELATED APPLICATION

This application claims priority from and the benefit of Korean Patent Application No. 10-2018-0041747, filed on Apr. 10, 2018, which is hereby incorporated by reference for all purposes as if fully set forth herein.

BACKGROUND

Field

Exemplary embodiments of the invention relate generally to a pixel and, more specifically, to pixel including a light emitting device and a display device including the same.

Discussion of the Background

With an increasing interest in information displays and an increasing demand for portable information media, display devices have been variously developed.

More particularly, in recent years, as the demand for a high resolution display device increases, the size of a pixel is becoming smaller while the structure of a circuit included in the pixel become more complicated.

The above information disclosed in this Background section is only for understanding of the background of the inventive concepts, and, therefore, it may contain information that does not constitute prior art.

SUMMARY

A pixel and a display device including the same according to an exemplary embodiment of the present invention is capable of minimizing defects and improving reliability of the display device.

Additional features of the inventive concepts will be set forth in the description which follows, and in part will be apparent from the description, or may be learned by practice of the inventive concepts.

A pixel according to an exemplary embodiment includes a light emitting element, a first transistor connected between a first node and the light emitting element, the first transistor configured to control an amount of current flowing from a first power supply of the first node to a second power supply via the light emitting element, a second transistor connected between a data line and the first transistor, the second transistor configured to be turned on by an $i^{th}$ first scan signal, wherein i is a natural number of 2 or more, a third transistor connected between the first transistor and the first node, the third transistor configured to be turned on by the $i^{th}$ first scan signal and comprising a P-type thin film transistor, a fourth transistor connected between the first node and an initialization power supply line to which an initialization power supply is supplied, the fourth transistor configured to be turned on by an $i-1^{th}$ scan signal and including an N-type thin film transistor, and a first connection line connected between the third transistor and the fourth transistor, the first connection line configured to electrically connect a semiconductor pattern of the third transistor and a semiconductor pattern of the fourth transistor, in which the first connection line is disposed on the third transistor and the fourth transistor with an insulation layer interposed therebetween, and contacts the semiconductor pattern of each of the third transistor and the fourth transistor through a first contact hole passing through the insulation layer.

The semiconductor pattern of the third transistor may be doped with a p-type impurity, and the semiconductor pattern of the fourth transistor may be doped with an n-type impurity.

The semiconductor pattern of the third transistor and the semiconductor pattern of the fourth transistor may be disposed on the same layer of a substrate and are adjacent to each other.

The substrate may include an overlap region where the semiconductor pattern of the third transistor and the semiconductor pattern of the fourth transistor overlap with each other, and the first connection line may contact the semiconductor pattern of the third transistor, the semiconductor pattern of the fourth transistor, and the overlap region.

The substrate may includes an undoped region, to which the p-type impurity and the n-type impurity are not doped, and disposed between the semiconductor pattern of the third transistor and the semiconductor pattern of the fourth transistor, and the first connection line may contact each of the semiconductor pattern of the third transistor and the semiconductor pattern of the fourth transistor with the undoped region interposed therebetween.

The pixel may further include a fifth transistor connected between the initialization power supply line and an anode electrode of the light emitting element, the fifth transistor configured to be turned on by an $i^{th}$ second scan signal and including an N-type thin film transistor.

The $i^{th}$ first scan signal and the $i^{th}$ second scan signal may have different levels from each other and may be simultaneously supplied to a corresponding transistor to activate the corresponding transistor.

The pixel may further include a sixth transistor connected between a second electrode of the first transistor and the anode electrode of the light emitting element, the sixth transistor configured to be turned off when an emission control signal is supplied to an emission control line, and a seventh transistor connected between the first node and the first power supply and configured to be turned off when the emission control signal is supplied, in which the sixth transistor and the seventh transistor may include a P-type thin film transistor.

The pixel may further include a second connection line connected between the fifth transistor and the sixth transistor and configured to electrically connect a semiconductor pattern of the fifth transistor and a semiconductor pattern of the sixth transistor, in which the second connection line may be disposed on the fifth transistor and the sixth transistor with the insulation layer interposed therebetween, and contacts the semiconductor pattern of each of the fifth transistor and the sixth transistor through a second contact hole passing through the insulation layer.

The semiconductor pattern of the fifth transistor may be doped with an n-type impurity, and the semiconductor pattern of the sixth transistor is doped with a p-type impurity.

The semiconductor pattern of the fifth transistor and the semiconductor pattern of the sixth transistor may be disposed on the same layer of a substrate and are adjacent to each other.

The first transistor and the second transistor may include a P-type thin film transistor.

A pixel according to another exemplary embodiment includes a light emitting element, a first transistor connected between a first node and the light emitting element, the first transistor configured to control an amount of current flowing from a first power supply of the first node to a second power supply via the light emitting element, a second transistor connected between a data line and the first transistor, the second transistor configured to be turned on by an $i^{th}$ first scan signal, wherein i is a natural number of 2 or more, a third transistor connected between the first transistor and the first node, the third transistor configured to be turned on by the ith first scan signal, a fourth transistor connected between the first node and an initialization power supply line to which an initialization power supply is supplied, the fourth transistor configured to be turned on by an $i-1^{th}$ scan signal, a fifth transistor connected between the first node and the first power supply, the fifth transistor configured to be turned off when an emission control signal is supplied to an emission control line, a sixth transistor connected between a second electrode of the first transistor and an anode electrode of the light emitting element, the sixth transistor configured to be turned off when the emission control signal is supplied, a seventh transistor connected between the initialization power supply line and the anode electrode of the light emitting element, the seventh transistor configured to be turned on by an $i^{th}$ second scan signal, a first connection line connected between the third transistor and the fourth transistor, the first connection line configured to electrically connect a semiconductor pattern of the third transistor and a semiconductor pattern of the fourth transistor, and a second connection line connected between the sixth transistor and the seventh transistor, the second connection line configured to electrically connect a semiconductor pattern of the sixth transistor and a semiconductor pattern of the seventh transistor, in which the fourth transistor and the seventh transistor include an N-type thin film transistor, and the first, second, third, fifth, sixth transistors include a P-type thin film transistor.

The first connection line may be disposed on the third transistor and the fourth transistor with an insulation layer interposed therebetween, and may contact the semiconductor pattern of each of the third transistor and the fourth transistor through a first contact hole passing through the insulation layer, and the second connection line may be disposed on the sixth transistor and the seventh transistor with the insulation layer interposed therebetween, and may contact the semiconductor pattern of each of the sixth transistor and the seventh transistor through a second contact hole passing through the insulation layer.

The semiconductor pattern of the fourth transistor and the semiconductor pattern of the seventh transistor may be doped with an n-type impurity, and the semiconductor patterns of the first, second, third, fifth, and sixth transistors may be doped with a p-type impurity.

The semiconductor pattern of the third transistor and the semiconductor pattern of the fourth transistor may be disposed on the same layer of a substrate and are adjacent to each other, and the semiconductor pattern of the sixth transistor and the semiconductor pattern of the seventh transistor may be disposed on the same layer of the substrate and are adjacent to each other.

The substrate may include an overlap region where the semiconductor pattern of the third transistor and the semiconductor pattern of the fourth transistor overlap with each other, and the first connection line may contact the semiconductor pattern of the third transistor, the semiconductor pattern of the fourth transistor, and the overlap region.

The substrate may include an undoped region, to which the p-type impurity and the n-type impurity are not doped, and disposed between the semiconductor pattern of the third transistor and the semiconductor pattern of the fourth transistor, and the first connection line may contact each of the semiconductor pattern of the third transistor and the semiconductor pattern of the fourth transistor with the undoped region interposed therebetween.

A display device according to yet another exemplary embodiment includes a substrate, a plurality of pixels disposed on the substrate and connected to a plurality of scan lines, a plurality of emission control lines, and a plurality of data lines, and a driver configured to drive the scan lines, the emission control lines, and the data lines, in which at least one pixel disposed in an $i^{th}$ (i is a natural number of 2 or more) horizontal line of the pixels includes a light emitting element, a first transistor connected between a first node and the light emitting element, the first transistor configured to control an amount of current flowing from a first power supply of the first node to a second power supply via the light emitting element, a second transistor connected between a corresponding data line and the first transistor, the second transistor configured to be turned on by an ith first scan signal, a third transistor connected between the first transistor and the first node, the third transistor configured to be turned on by the ith first scan signal and including a P-type thin film transistor, a fourth transistor connected between the first node and an initialization power supply line to which an initialization power supply is supplied, the fourth transistor configured to be turned on by an $i-1^{th}$ scan signal and including an N-type thin film transistor, and a first connection line connected between the third transistor and the fourth transistor, the first connection line configured to electrically connect a semiconductor pattern of the third transistor and a semiconductor pattern of the fourth transistor, and in which the first connection line is disposed on the third transistor and the fourth transistor with an insulation layer on the substrate interposed therebetween, and contacts the semiconductor pattern of each of the third transistor and the fourth transistor through a first contact hole passing through the insulation layer.

The semiconductor pattern of the third transistor may be doped with a p-type impurity, and the semiconductor pattern of the fourth transistor may be doped with an n-type impurity.

The semiconductor pattern of the third transistor and the semiconductor pattern of the fourth transistor may be disposed on the same layer of a substrate and are adjacent to each other.

The substrate may include an overlap region where the semiconductor pattern of the third transistor and the semiconductor pattern of the fourth transistor overlap with each other, and the first connection line may contact the semiconductor pattern of the third transistor, the semiconductor pattern of the fourth transistor, and the overlap region.

The substrate may include an undoped region, to which the p-type impurity and the n-type impurity are not doped, and disposed between the semiconductor pattern of the third transistor and the semiconductor pattern of the fourth transistor, and the first connection line may contact each of the semiconductor pattern of the third transistor and the semiconductor pattern of the fourth transistor with the undoped region interposed therebetween.

The display device may further include a fifth transistor connected between the initialization power supply line and an anode electrode of the light emitting element, the fifth transistor configured to be turned on by an $i^{th}$ second scan signal and including an N-type thin film transistor.

The i$^{th}$ first scan signal and the i$^{th}$ second scan signal may have different levels from each other, and may be simultaneously supplied to a corresponding transistor to activate the corresponding transistor.

The display device may further include a sixth transistor connected between a second electrode of the first transistor and the anode electrode of the light emitting element, the sixth transistor configured to be turned off when an emission control signal is supplied to an corresponding emission control line, and a seventh transistor connected between the first node and the first power supply, the seventh transistor configured to be turned off when the emission control signal is supplied, in which the sixth transistor and the seventh transistor may include a P-type thin film transistor.

The display device may further include a second connection line connected between the fifth transistor and the sixth transistor, the second connection line configured to electrically connect a semiconductor pattern of the fifth transistor and a semiconductor pattern of the sixth transistor, in which the second connection line may be disposed on the fifth transistor and the sixth transistor with the insulation layer interposed therebetween, and contacts the semiconductor pattern of each of the fifth transistor and the sixth transistor through a second contact hole passing through the insulation layer.

The semiconductor pattern of the fifth transistor maybe doped with a n-type impurity, and the semiconductor pattern of the sixth transistor may be doped with an p-type impurity.

The semiconductor pattern of the fifth transistor and the semiconductor pattern of the sixth transistor may be disposed on the same layer of a substrate, and are adjacent to each other.

The first transistor and the second transistor may include a P-type thin film transistor.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
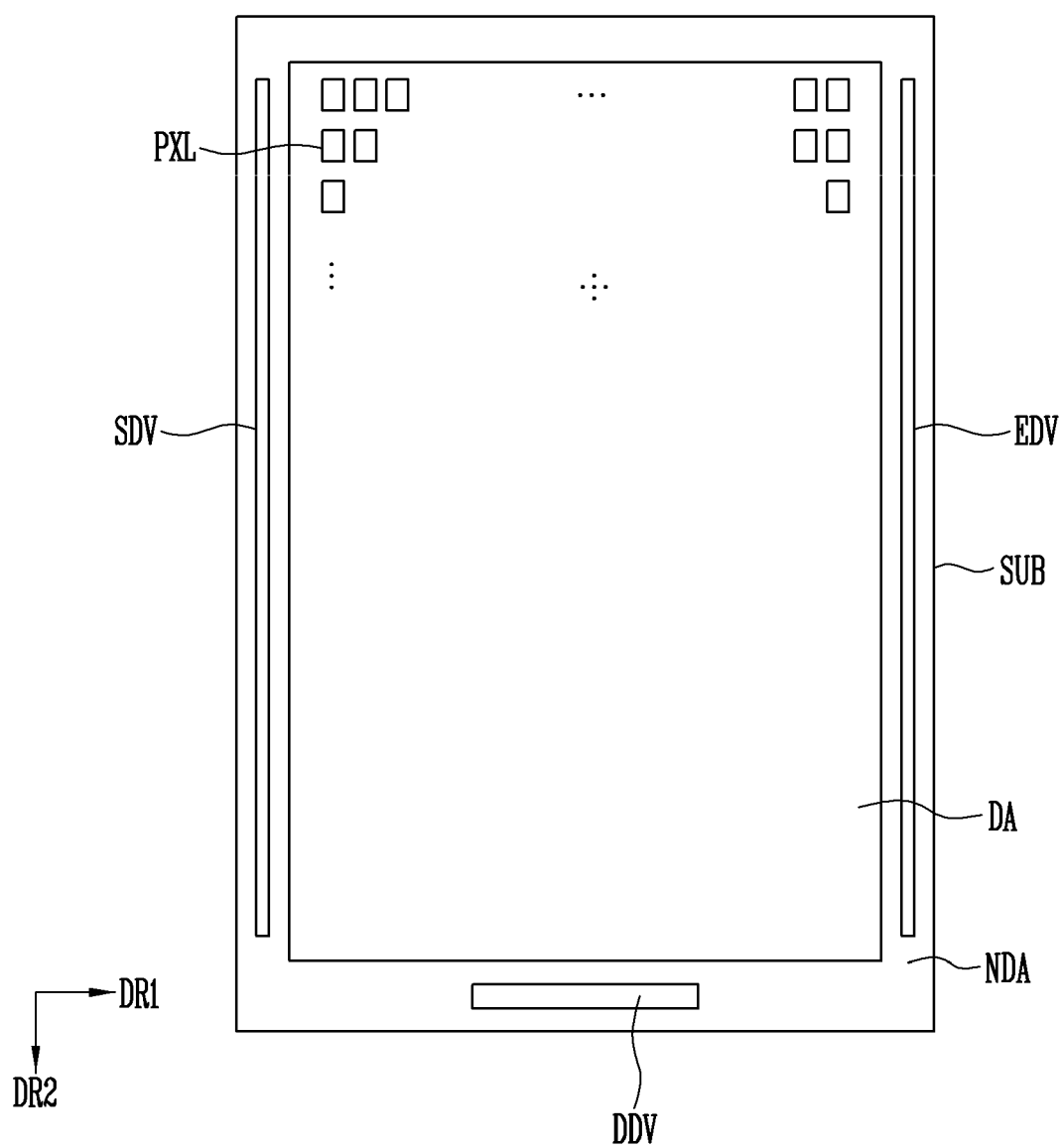
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device according to an exemplary embodiment.

Referring to FIG. 1, a display device according to an exemplary embodiment may include a substrate SUB, pixels PXL provided on the substrate SUB, a driver provided on the substrate SUB and driving the pixels PXL, and a line unit (not shown) connecting the pixels PXL and the driver.

The substrate SUB may include a display region DA and a non-display region NDA. The display region DA may be a region in which the pixels PXL for displaying an image are provided. Each pixel PXL will be described in more detail later. The non-display region NDA may be a region in which the driver for driving the pixels PXL and a portion of a line (not shown) connecting the pixels PXL and the driver are provided.

The display region DA may have various shapes. For example, the display region DA may be provided in various shapes, such as a closed polygon including sides made of straight lines, a circle, an ellipse including sides made of curved lines, a semicircle, a semi-ellipse including sides made of straight lines and curved lines, and the like. When the display region DA includes a plurality of regions, each region may also be provided in various shapes, such as a closed polygon including sides of straight lines, a semicircle, a semi-ellipse including sides of curved lines, and the like. In addition, areas of the plurality of regions may be the same as or different from each other.

Hereinafter, the display region DA according to an exemplary embodiment will be described as including one region having a quadrangle shape, which includes sides of a straight line. The non-display region NDA may be provided on at least one side of the display region DA. In an exemplary embodiment, the non-display region NDA may surround the display region DA.

The pixels PXL may be provided in the display region DA on the substrate SUB, and may be connected to the line. Each pixel PXL may be a minimum unit for displaying an image, and may be provided in plural.

The pixels PXL may include a light emitting device, which emits white light and/or color light, and a pixel circuit for driving the light emitting device. The pixel circuit may include at least one transistor connected to the light emitting device.

Each pixel PXL may emit at least one of red, green, and blue colors, but is not limited thereto. For example, each pixel PXL may emit at least one of cyan, magenta, yellow, and white colors. The pixels PXL are arranged along rows extending in a first direction DR1 and columns extending in a second direction DR2 crossing the first direction DR1. However, an arrangement form of the pixels PXL is not particularly limited, and may be arranged in various forms.

The driver may supply a signal to each pixel PXL through the line unit, thereby controlling the driving of the pixel PXL. In FIG. 1, the line unit is not shown, however, the line unit will be described in more detail later.

The driver may include a scan driver SDV for supplying a scan signal to the pixels PXL through a scan line, an emission driver EDV for supplying an emission control signal to the pixels PXL through an emission control line, a data driver DDV for supplying a data signal to the pixels PXL through a data line, and a timing controller. The timing controller may control the scan driver SDV, the emission driver EDV, and the data driver DDV.

The scan driver SDV may be disposed in a vertical portion of the non-display region NDA. The vertical portion of the non-display region NDA may be provided in a pair spaced apart from each other along the width direction of the display region DA. As such, the scan driver SDV may be disposed in at least one of the vertical portions of the non-display region NDA. The scan driver SDV may extend in the longitudinal direction of the non-display region NDA.

The emission driver EDV may also be disposed in a vertical portion of the non-display region NDA, similarly to the scan driver SDV. The emission driver EDV may be disposed in at least one of the vertical portions of the non-display region NDA. The emission driver EDV may extend in the longitudinal direction of the non-display region NDA.

In an exemplary embodiment, the scan driver SDV may be provided at one of the vertical portions, and the emission driver EDV may be provided at the other of the vertical portions. However, the inventive concepts are not limited thereto, and the scan driver SDV and the emission driver EDV may be disposed adjacent to each other and formed only at one of the vertical portions of the non-display region NDA.

The data driver DDV may be disposed in the non-display region NDA. More particularly, the data driver DDV may be disposed in a horizontal portion of the non-display region NDA. The data driver DDV may extend in the width direction of the non-display region NDA. The inventive concepts are not limited to particular positions of the drivers, and the positions of the scan driver SDV, the emission driver EDV, and/or the data driver DDV may be variously changed as needed.

The timing controller may be connected to the scan driver SDV, the emission driver EDV, and the data driver DDV through lines in various ways. The position of the timing controller is not particularly limited. For example, the timing controller may be mounted on a printed circuit board and may be connected to the scan driver SDV, the emission driver EDV, and the data driver DDV through a flexible printed circuit board. The printed circuit board may be disposed at various positions, such as one side of the substrate SUB, a backside of the substrate SUB, and the like.

Figure 2:
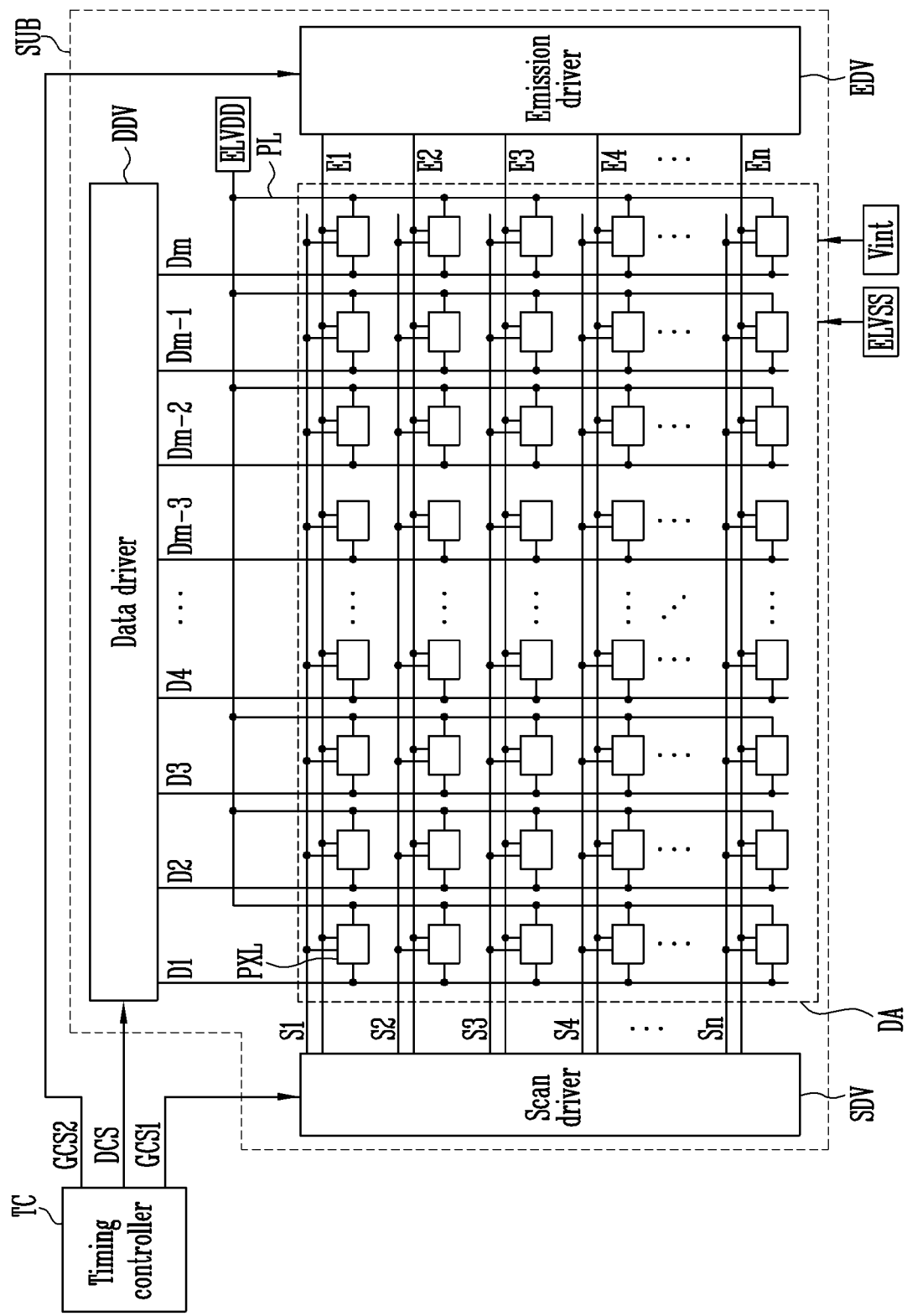
FIG. 2 is a block diagram of pixels and a driver in a display device of FIG. 1 according to an exemplary embodiment.

FIG. 2 is a block diagram of pixels and a driver in a display device of FIG. 1 according to an exemplary embodiment.

Referring to FIGS. 1 and 2, a display device according to an exemplary embodiment may include pixels PXL, a driver, and a line unit.

The driver may include a scan driver SDV, an emission driver EDV, a data driver DDV, and a timing controller TC. The positions of the scan driver SDV, the emission driver EDV, the data driver DDV, and the timing controller TC shown in FIG. 2 may be varied to be disposed at other positions in the display device when a real display device is actually implemented.

The line unit may include a scan line, a data line, an emission control line, a power supply line PL, and an initialization power supply line disposed in the display region DA to supply a signal to each pixel PXL from the driver.

The scan line may include a plurality of scan lines S1 to Sn, the emission control line may include a plurality of emission control lines E1 to En, and the data lines may include a plurality of data lines D1 to Dm.

The pixels PXL may include a light emitting device, which emits light, and a pixel circuit for driving the light emitting device. The pixel circuit may include at least one transistor connected to the light emitting device. The pixels PXL may be provided in the display region DA. Each pixel PXL may receive a data signal from a data line corresponding thereto when a scan signal is supplied from a scan line corresponding thereto. Each pixel PXL receiving the data signal may control the amount of current amount flowing from the first power supply ELVDD provided through the power supply line PL to the second power supply ELVSS through an light emitting device.

The scan driver SDV may supply the scan signal to the scan lines S1 to Sn in response to the first gate control signal GCS1 from the timing controller TC. For example, the scan driver SDV may sequentially supply the scan signal to the scan lines S1 to Sn. When the scan signal is sequentially supplied to the scan lines S1 to Sn, the pixels PXL may be sequentially selected in horizontal line units.

The emission driver EDV may apply the emission control signal to the emission control lines E1 to En in response to the second gate control signal GCS2 from the timing controller TC. For example, the emission controller EDV may sequentially supply the emission control signals to the emission control lines E1 to En.

As used herein, the emission control signal may be set to have a greater width than the scan signal. For example, the emission control signal supplied to the $i^{th}$ emission control line Ei (i is a natural number) may overlap at least one portion of a scan signal supplied to the $i-1^{th}$ scan line Si-1 and a scan signal supplied to the $i^{th}$ scan line Si. In addition, the emission control signal may be set to a gate-off voltage (e.g., a high voltage) so that the transistor included in the pixels PXL may be turned off, and the scan signal may be set to a gate-on voltage (e.g., a low voltage) so that the transistor included in the pixels PXL may be turned on.

The data driver DDV may supply the data signal to the data lines D1 to Dm in response to a data control signal DCS. The data signal supplied to the data lines D1 to Dm may be supplied to the pixels PXL selected by the scan signal.

The timing controller TC may supply a gate control signals GCS1 and GCS2 based on timing signals supplied from the outside to the scan driver SDV and the emission driver EDV, and may supply the data control signal DCS to the data driver DDV. Each of the gate control signals GCS1 and GCS2 may include a start pulse and clock signals. The start pulse controls the timing of the first scan signal or the first emission control signal. The clock signals are used to shift the start pulse.

The data control signal DCS includes a source start pulse and clock signals. The source start pulse are used to control the sampling start time of the data, and the clock signals are used to control the sampling operation.

Figure 3:
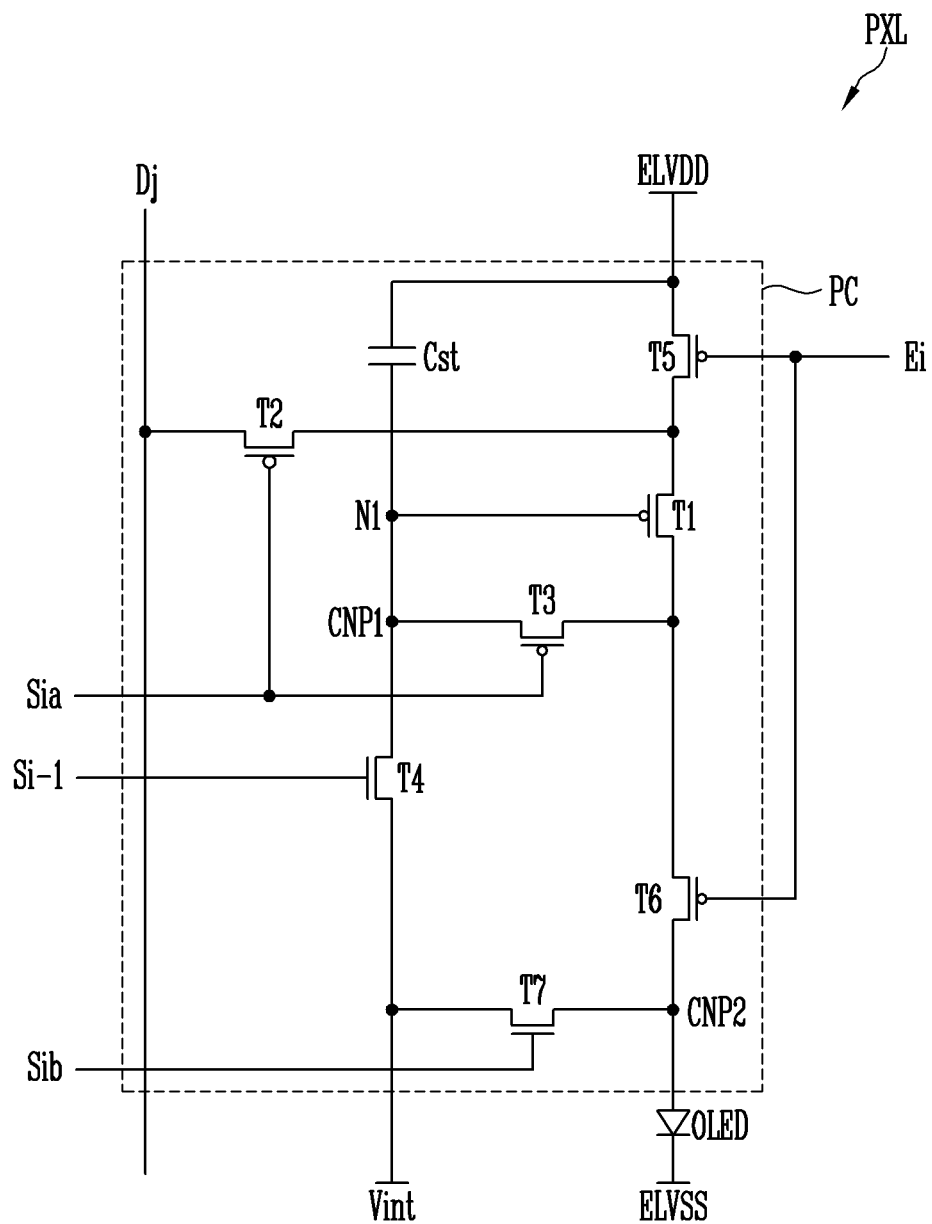
FIG. 3 is an equivalent circuit diagram of one pixel of the pixels shown in FIG. 2.

FIG. 3 is an equivalent circuit diagram of one pixel of the pixels shown in FIG. 2.

FIG. 3 shows one pixel connected to the $j^{th}$ data line Dj, the $i-1^{th}$ scan line Si-1, the $i^{th}$ scan line Si, and the $i+1^{th}$ scan line Si+1. Referring to FIGS. 2 and 3, the pixel PXL according to an exemplary embodiment may include a light emitting device OLED, and a pixel circuit PC connected to the light emitting device OLED to drive the light emitting device OLED. Herein, the pixel circuit PC may include first to seventh transistors T1 to T7, and a storage capacitor Cst.

An anode electrode of the light emitting device OLED may be connected to the first transistor T1 via the sixth transistor T6, and a cathode electrode of the light emitting device OLED may be connected to the second power supply ELVSS.

The light emitting device OLED may generate light having a predetermined luminance corresponding to the amount of current supplied from the first transistor T1. The first power supply ELVDD supplied to the power supply line PL may be set to a higher voltage than the second power supply ELVSS, so that current may flow through the light emitting device OLED.

A source electrode of the first transistor T1 (i.e., a driving transistor) is connected to the first power supply ELVDD via the fifth transistor T5, and a drain electrode of the first transistor T1 is connected to the anode electrode of the light emitting device OLED via the sixth transistor T6. The first transistor T1 may be a P-type thin film transistor.

The first transistor T1 controls the current amount flowing from the first power supply ELVDD to the second power supply ELVSS via the light emitting device OLED corresponding to the voltage of the first node N1, which is a gate electrode thereof.

The second transistor T2 (i.e., a switching transistor) is connected between the $j^{th}$ data line Dj and the source electrode of the first transistor T1. The gate electrode of the second transistor T2 is connected to the $i^{th}$ first scan line Sia. The second transistor T2 may be a P-type thin film transistor. When a scan signal is supplied to the $i^{th}$ first scan line Sia, the second transistor T2 is turned on to electrically connect the $j^{th}$ data line Dj to the source electrode of the first transistor T1.

The third transistor T3 is connected between the drain electrode of the first transistor T1 and the first node N1. A gate electrode of the third transistor T3 is connected to the $i^{th}$ first scan line Sia. The third transistor T3 may be a P-type thin film transistor. When a scan signal is supplied to the $i^{th}$ scan line Si, the third transistor T3 is turned on to electrically connect the drain electrode of the first transistor T1 to the first node N1. Therefore, when the third transistor T3 is turned on, the first transistor T1 is connected in a diode form.

The fourth transistor T4 is connected between the first node N1 and the initialization power supply Vint. A gate electrode of the fourth transistor T4 is connected to the $i-1^{th}$ scan line Si−1. When a scan signal is supplied to the $i-1^{th}$ scan line Si−1, the fourth transistor T4 is turned on to supply the voltage of the initialization power supply Vint to the first node N1.

In an exemplary embodiment, the fourth transistor T4 may be a N-type thin film transistor. The N-type thin film transistor may have better off current characteristic than the P-type thin film transistor. When the fourth transistor T4 is formed of an N-type thin film transistor, a leakage current flowing from the first node N1 to the initialization power supply Vint may be minimized, thereby displaying an image with a desired luminance.

The fifth transistor T5 is connected between the first power supply ELVDD and the source electrode of the first transistor T1. A gate electrode of the fifth transistor T5 is connected to the $i^{th}$ emission control line Ei. The fifth transistor T5 may be a P-type thin film transistor. The fifth transistor T5 is turned off when the emission control signal is supplied to the $i^{th}$ emission control line Ei, and is turned on in other cases.

The sixth transistor T6 is connected between the drain electrode of the first transistor T1 and the anode electrode of the light emitting device OLED. A gate electrode of the sixth transistor T6 is connected to the $i^{th}$ emission control line Ei. The sixth transistor T6 may be a P-type thin film transistor. The sixth transistor T6 is turned off when the emission control signal is supplied to the $i^{th}$ emission control line Ei, and is turned on in other cases.

The seventh transistor T7 is connected between the initialization power supply Vint and the anode electrode of the light emitting device OLED. A gate electrode of the seventh transistor T7 is connected to the $i^{th}$ second scan line Sib. When a scan signal is supplied to the $i^{th}$ second scan line Sib, the seventh transistor T7 is turned on to supply the voltage of the initialization power supply Vint to the anode electrode of the light emitting device OLED.

The seventh transistor T7 may be an N-type thin film transistor. Since the seventh transistor T7 is formed of an N-type thin film transistor, a leakage current supplied from the anode electrode of the light emitting device OLED to the initialization power supply Vint during an emission period of the light emitting device OLED may be minimized.

As described above, if the leakage current supplied from the anode electrode of the light emitting device OLED to the initialization power supply Vint is minimized, the light emitting device OLED may generate light of desired luminance.

The storage capacitor Cst is connected between the first power supply ELVDD and the first node N1. The storage capacitor Cst stores a voltage corresponding to the data signal and the threshold voltage of the first transistor T1.

Meanwhile, the initialization power supply Vint may be set to a lower voltage than the data signal. When the voltage of the initialization power supply Vint is supplied to the anode electrode of the light emitting device OLED, a parasitic capacitor of the light emitting device OLED may be discharged.

When the parasitic capacitor of the light emitting device OLED is discharged by the initialization power supply Vint, the light emitting device OLED may be set to a non-emission state even if a leakage current is supplied from the first transistor T1. More particularly, the leakage current from the first transistor T1 pre-charges the parasitic capacitor of the light emitting device OLED, so that the parasitic capacitor of the light emitting device OLED may maintain the non-emission state.

The pixel PXL may include first and second contact portions CNP1 and CNP2 indicating regions in which different types of thin film transistors are in contact with each other.

The first contact portion CNP1 may be disposed between the third transistor T3 formed of a P-type thin film transistor and the fourth transistor T4 formed of an N-type thin film transistor. The second contact CNP2 may be disposed between the sixth transistor T6 formed of the P-type thin film transistor and the seventh transistor T7 formed of the N-type thin film transistor.

In an exemplary embodiment, the fourth transistor T4 and the seventh transistor T7 may be formed the N-type thin film transistor and the other transistors T1, T2, T3, T5 and T6 may be formed of the P-type thin film transistor.

Hereinafter, the operation of the pixel according to an exemplary embodiment will be described with reference to FIG. 4.

Figure 4:
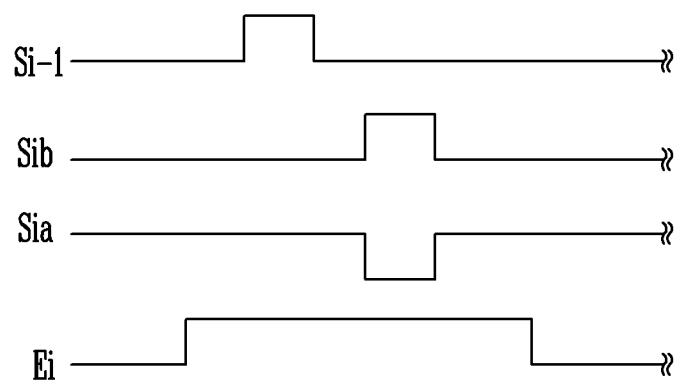
FIG. 4 is a waveform diagram illustrating a driving method of the pixel shown in FIG. 3 according to an exemplary embodiment.

FIG. 4 is a waveform diagram illustrating a driving method of the pixel shown in FIG. 3 according to an exemplary embodiment.

Referring to FIGS. 3 and 4, the emission control signal (of high level) is supplied to the $i^{th}$ emission control line Ei, whereby the fifth and sixth transistors T5 and T6 formed of the P-type thin film transistor are turned off.

When the fifth and sixth transistors T5 and T6 are turned off, an electrical connection between the first power supply ELVDD and the first node N1 may be cut off. Therefore, the pixel PXL may be set to the non-emission state during the period when the emission control signal is supplied.

Then, an $i-1^{th}$ scan signal (of high level) is supplied to an $i-1^{th}$ scan line Si-1. When the $i-1^{th}$ scan signal is supplied to the $i-1^{th}$ scan line Si-1, the fourth transistor T4, which is an N-type thin film transistor, is turned on.

When the fourth transistor T4 is turned on, the voltage of the initialization power supply Vint is supplied to the first node N1. After the voltage of the initialization power supply Vint is supplied to the first node N1, the $i^{th}$ first scan signal (of low level) is supplied to the $i^{th}$ first scan line Sia and the $i^{th}$ second scan signal (of high level) is supplied to the $i^{th}$ second scan line Sib.

When the $i^{th}$ second scan signal is supplied to the $i^{th}$ second scan line Sib, the seventh transistor T7, which is an N-type thin film transistor, is turned on. When the seventh transistor T7 is turned on, the voltage of the initialization power supply Vint is supplied to the anode electrode of the light emitting device OLED. When the voltage of the initialization power supply Vint is supplied to the anode electrode of the light emitting device OLED, the parasitic capacitor of the light emitting device OLED is discharged.

When the $i^{th}$ first scan signal is supplied to the $i^{th}$ first scan line Sia, the second and third transistors T2 and T3, which are P-type thin film transistors, are turned on.

When the second transistor T2 is turned on, the $j^{th}$ data line Dj and the source electrode of the first transistor T1 are electrically connected to each other. In this case, a data signal from the $j^{th}$ data line Dj is supplied to the first transistor T1.

When the third transistor T3 is turned on, the first node N1 and the drain electrode of the first transistor T1 are electrically connected to each other. In this case, the first transistor T1 may be connected in a diode form. At this time, since the first node N1 is initialized to the voltage of the initialization power supply Vint lower than the data signal, the first transistor T1 is turned on.

When the first transistor T1 is turned on, the data signal is supplied to the first node N1 via the first transistor T1. At this time, the first node N1 is set to a voltage corresponding to the data signal and the threshold voltage of the first transistor T1.

The storage capacitor Cst stores the voltage applied to the first node N1.

After the voltage of the first node N1 is stored in the storage capacitor Cst, the supply of the $i^{th}$ emission control signal to the $i^{th}$ emission control line Ei is stopped. When the supply of the $i^{th}$ emission control signal to the $i^{th}$ emission control line Ei is stopped, the fifth and sixth transistors T5 and T6 are turned on.

When the fifth transistor T5 is turned on, the voltage of the first power supply ELVDD is supplied to the source electrode of the first transistor T1. At this time, the first transistor T1 generates a driving current.

When the sixth transistor T6 is turned on, the first transistor T1 and the light emitting device OLED may be electrically connected to each other. At this time, the driving current generated by the first transistor T1 is supplied to the light emitting device OLED, and the light emitting device OLED outputs light having intensity corresponding to the driving current.

In an exemplary embodiment, a scan signal supplied to the $i^{th}$ first scan line Sia (hereinafter, referred to as a 'first scan signal') and a scan signal supplied to the $i^{th}$ second scan line Sib (hereinafter, referred to as a 'second scan signal') have different levels, and are simultaneously supplied to the corresponding transistors so that the corresponding transistors may be turned on, i.e., activated.

For example, the first scan signal of a low level may be supplied to the second and third transistors T2 and T3, and the second scan signal of a high level may be simultaneously supplied to the seventh transistor T7. Accordingly, the second and third transistors T2 and T3 and the seventh transistor T7 may be simultaneously turned on.

In an exemplary embodiment, the second scan signal has the same level as a scan signal supplied to the $i-1^{th}$ scan line Si-1 (hereinafter, referred to as 'third scan signal'), and are simultaneously supplied to the corresponding transistors so that the corresponding transistors may be turned on, i.e., activated.

For example, the second scan signal of a high level may be supplied to the seventh transistor T7 and the third scan signal of a high level may be simultaneously supplied to the fourth transistor T4. Accordingly, the fourth transistor T4 and the seventh transistor T7 may be simultaneously turned on.

Figure 5:
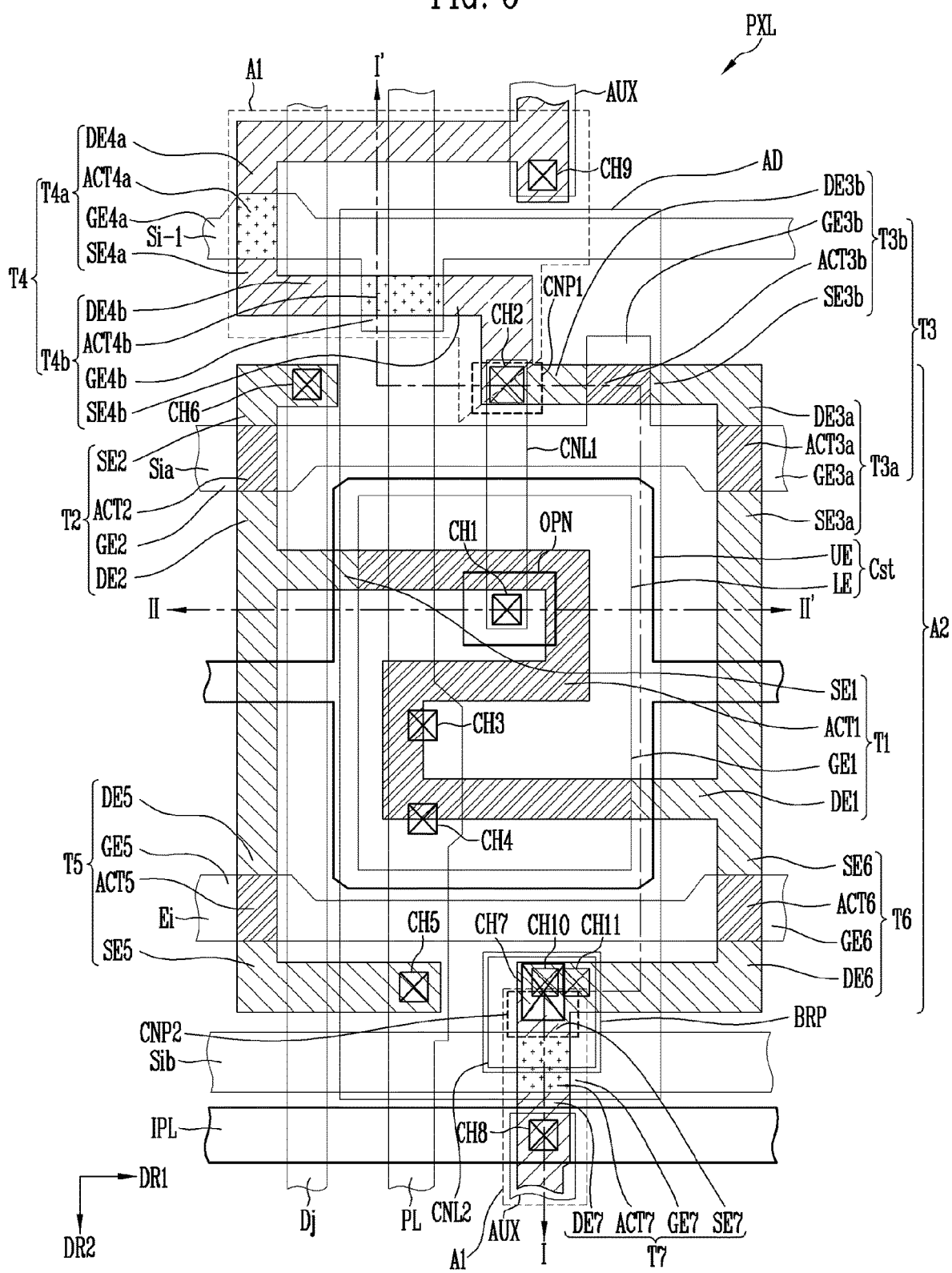
FIG. 5 is a plan view of one pixel shown in FIG. 3.
Figure 6:
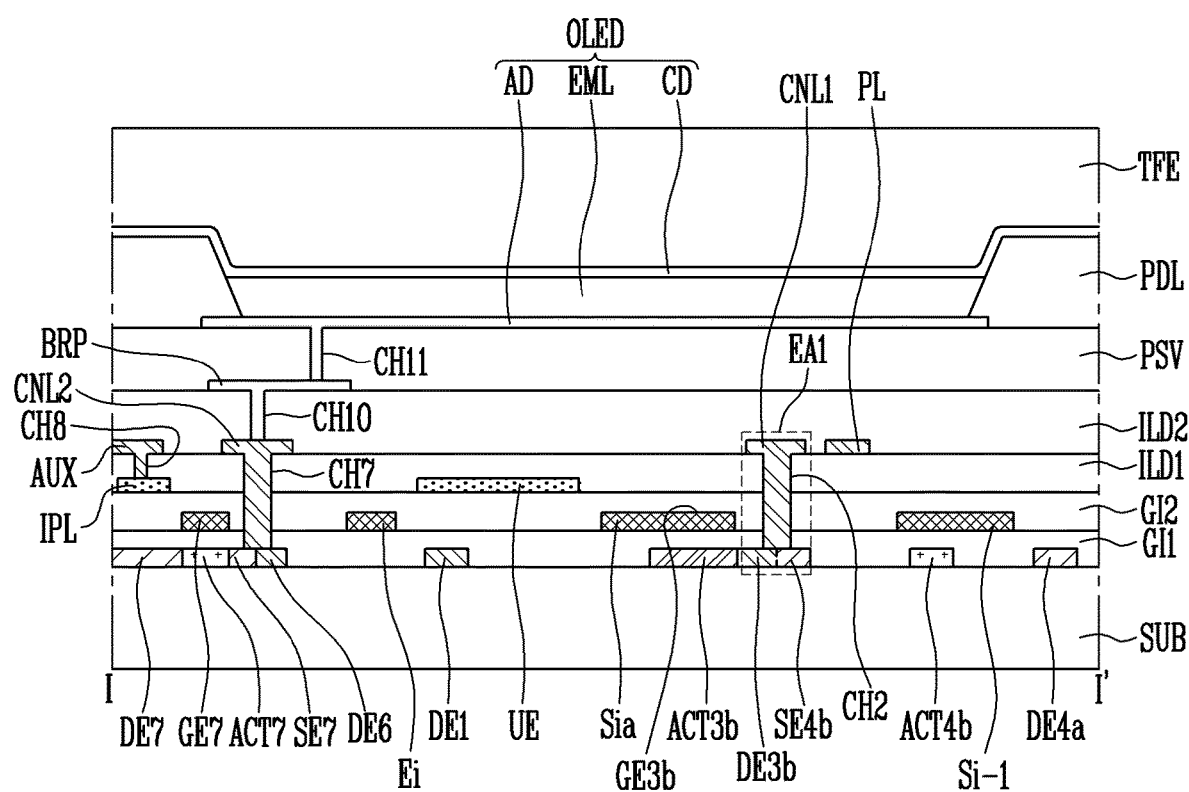
FIG. 6 is a cross-sectional view taken along line I-I' of FIG. 5.
Figure 7:
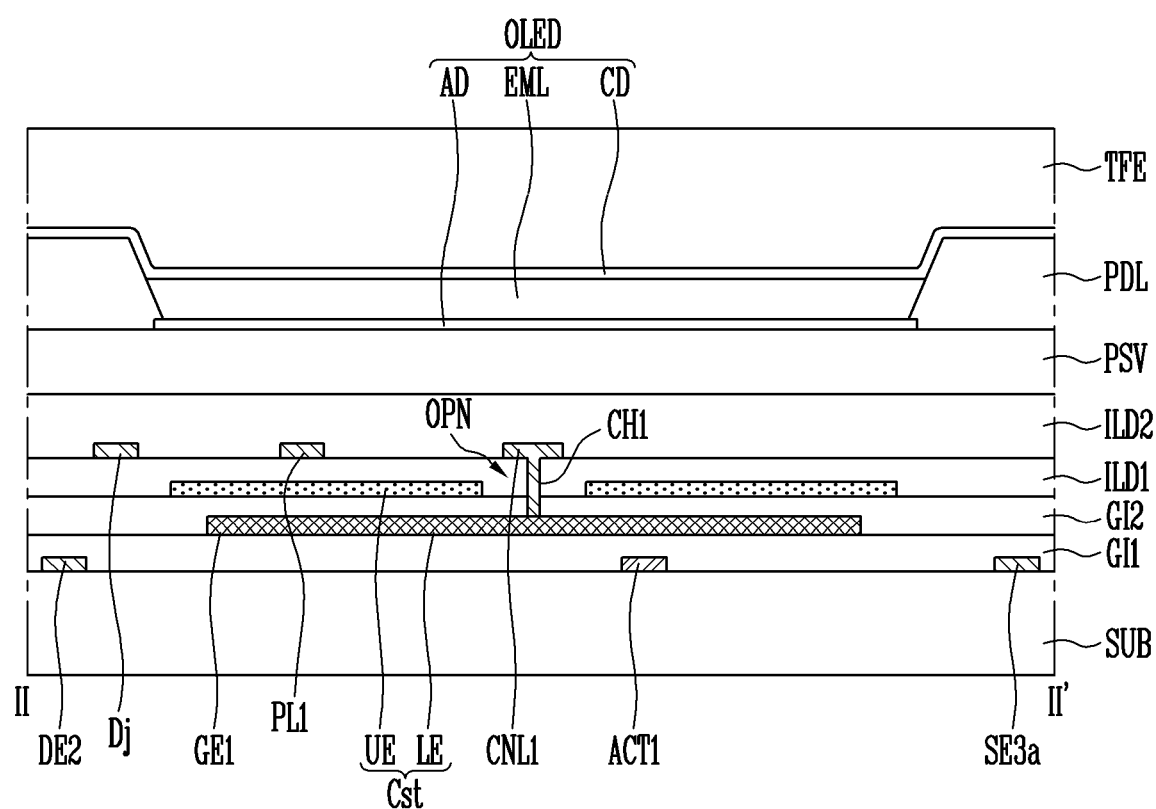
FIG. 7 is a cross-sectional view taken along line II-II' of FIG. 5.
Figure 8:
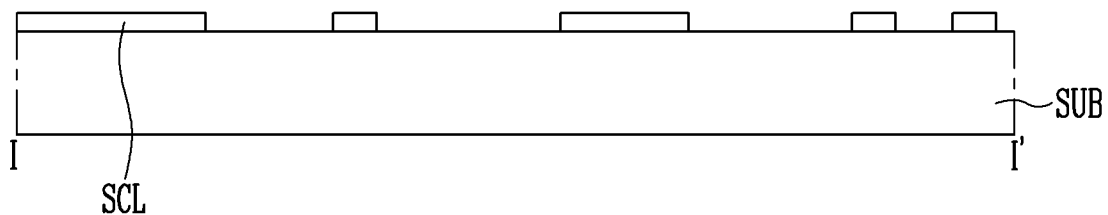
FIG. 8, FIG. 9, FIG. 10, FIG. 11, FIG. 12, FIG. 13, FIG. 14, FIG. 15, FIG. 16, FIG. 17, FIG. 18, and FIG. 19 are cross-sectional views sequentially showing a manufacturing method of the display device shown in FIG. 5.
Figure 9:
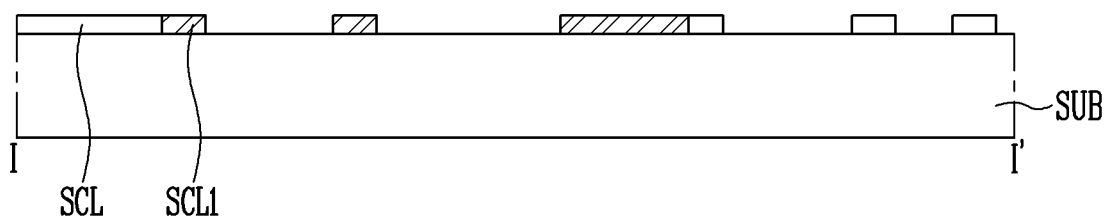
Figure 10:
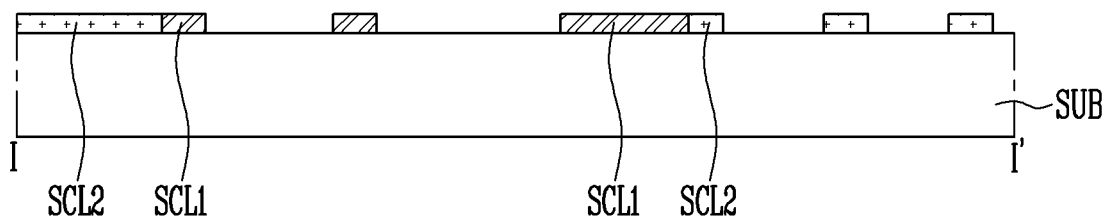
Figure 11:
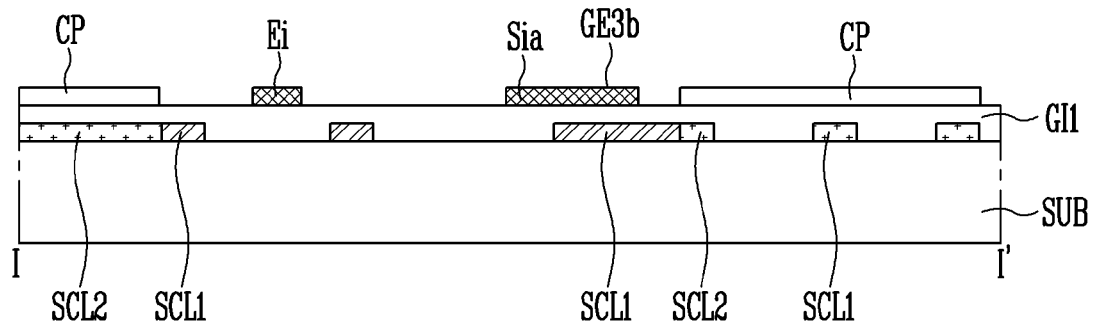
Figure 12:
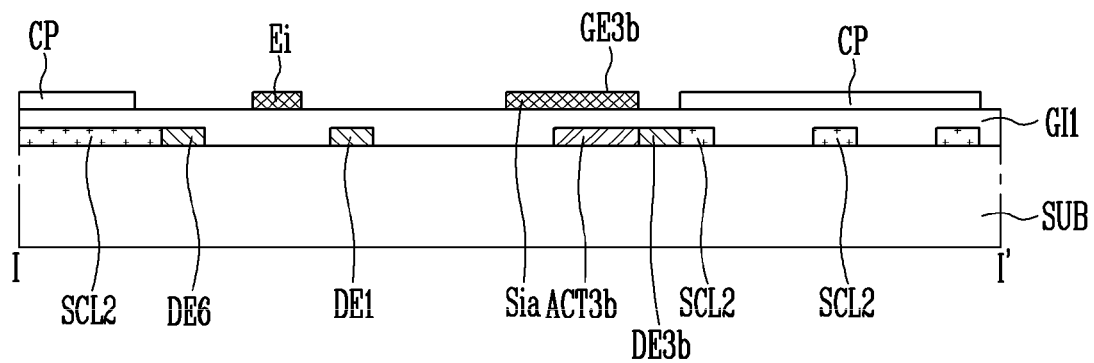
Figure 13:
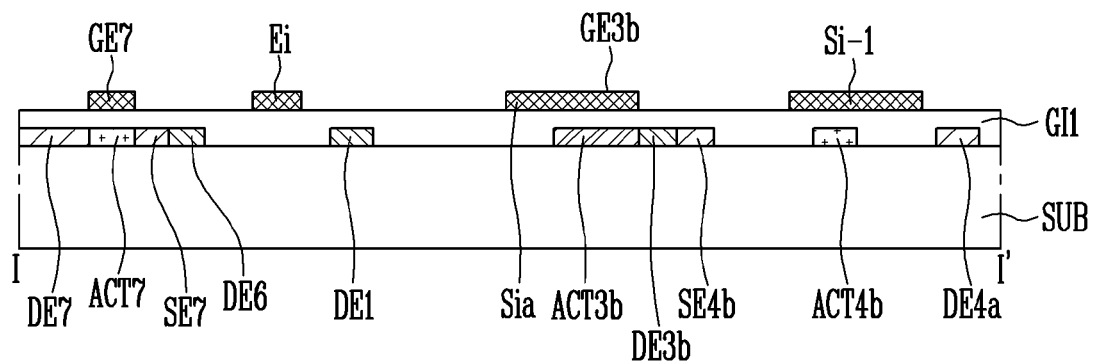
Figure 14:
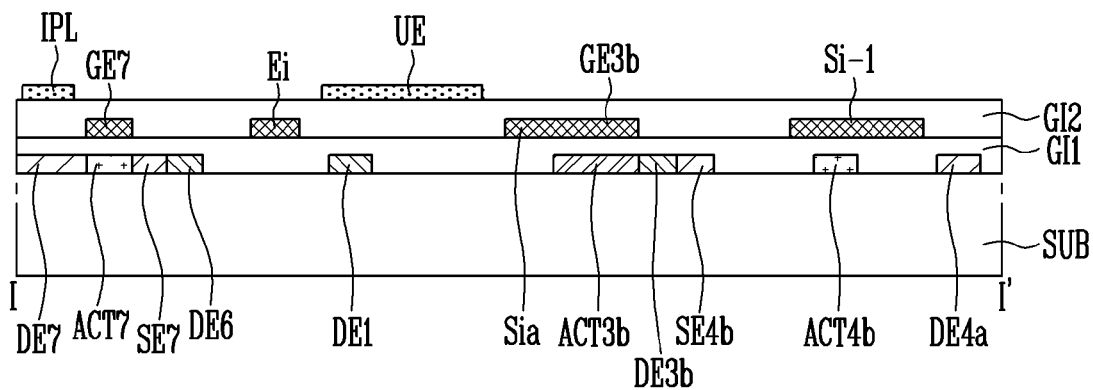
Figure 15:
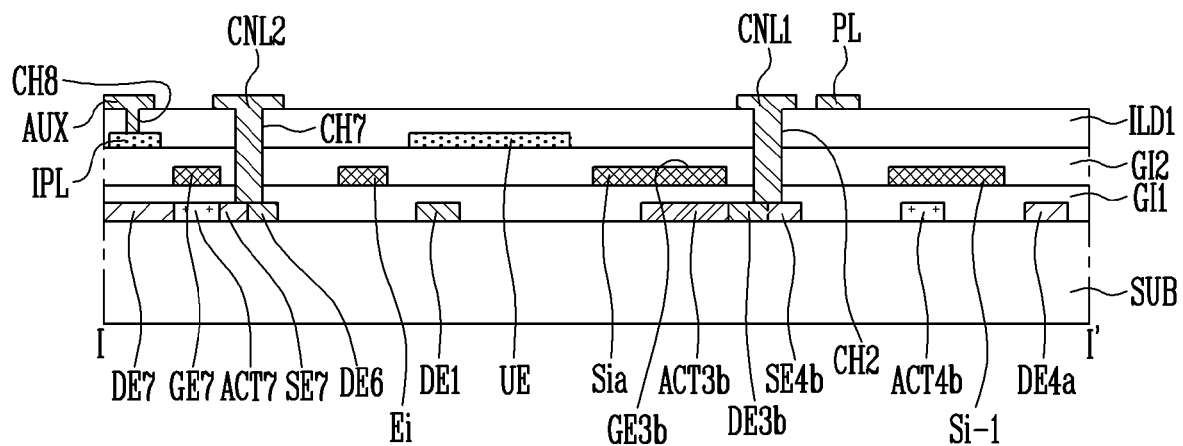
Figure 16:
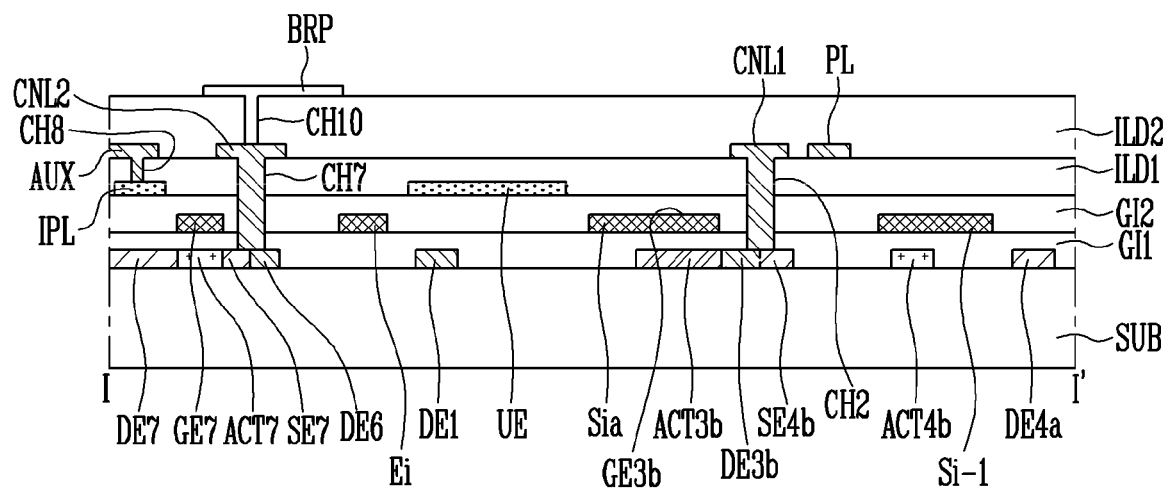
Figure 17:
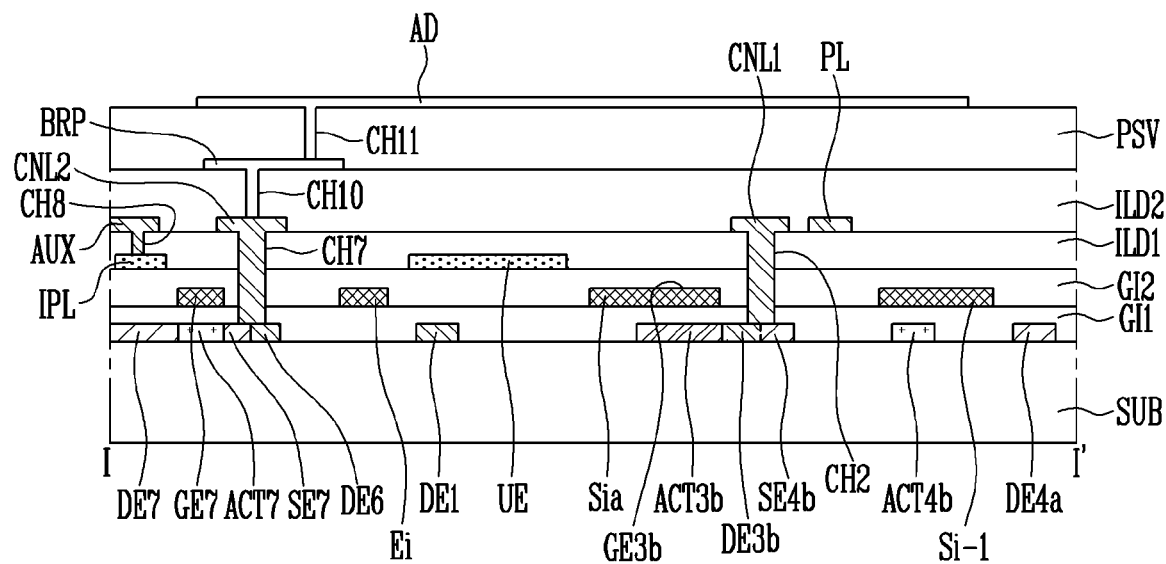
Figure 18:
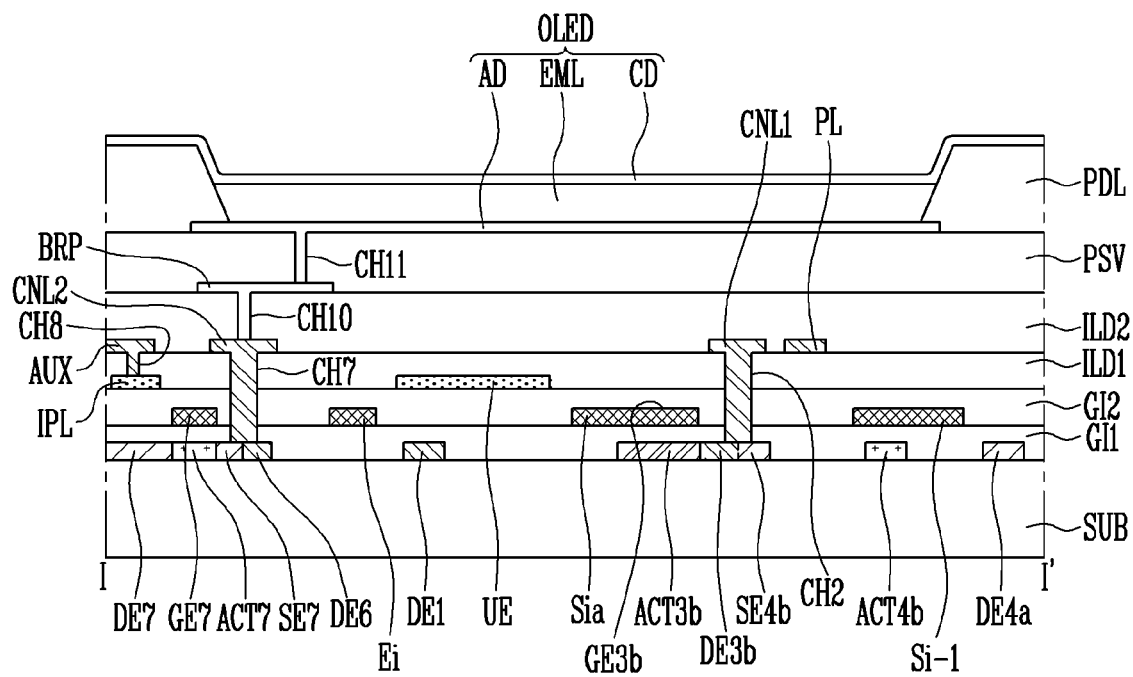
Figure 19:
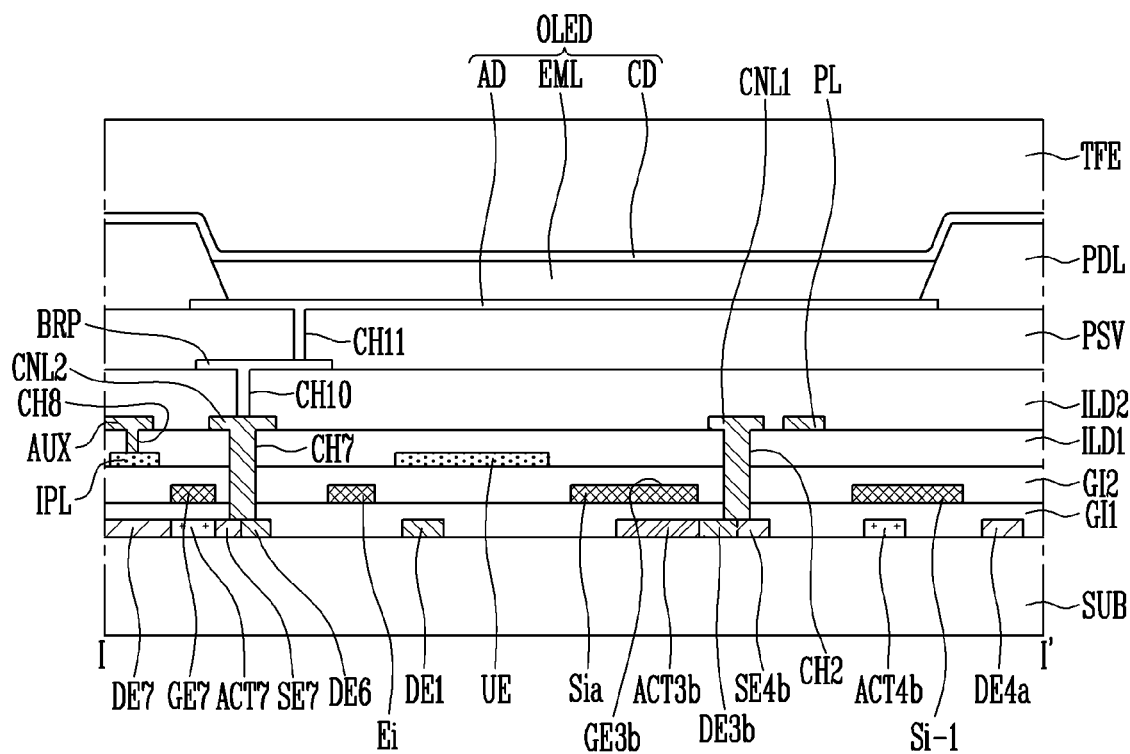

FIG. 5 is a plan view of one pixel shown in FIG. 3, FIG. 6 is a cross-sectional view taken along line I-I' of FIG. 5, and FIG. 7 is a cross-sectional view taken along line II-II' of FIG. 5.

The pixel PXL according to an exemplary embodiment is disposed in the $i^{th}$ row and the $j^{th}$ column of the display region, and FIGS. 5 to 7 show three scan lines Si-1, Sia and Sib, an emission control line Ei, the power supply line PL, and data line Dj connected to the one pixel PXL.

In FIGS. 5 to 7, the scan line of the $i-1^{th}$ row is referred to as "the $i-1^{th}$ scan line Si-1", the first scan line of the $i^{th}$ row is referred to as "the $i^{th}$ first scan line Sia", the second scan line of the $i^{th}$ row is referred to as "the $i^{th}$ second scan line Sib", the emission control line of the $i^{th}$ row is referred to as "an emission control line Ei", the data line of the $j^{th}$ column is referred to as "a data line Dj", and the power supply line of the $j^{th}$ column is referred to as "the power supply line PL".

Referring to FIGS. 1 to 7, a display device according to an exemplary embodiment may include a substrate SUB, a line unit, and the pixel PXL.

The substrate SUB may include a transparent insulating material to transmit light. In addition, the substrate SUB may be a rigid substrate or a flexible substrate. The rigid substrate may include a glass substrate, a quartz substrate, a glass ceramic substrate, and a crystalline glass substrate.

The flexible substrate may include a film substrate and a plastic substrate including a polymeric organic material. For example, the flexible substrate may include at least one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the flexible substrate may include fiberglass reinforced plastic (FRP).

The material of the substrate SUB may preferably have resistance (or heat resistance) against a high processing temperature from the manufacturing process of the display device. In an exemplary embodiment, the substrate SUB may be entirely or partially flexible.

The line unit may provide a signal to the pixel PXL, and may include a scan line Si−1, Sia, Sib, a data line Dj, an emission control line Ei, a power supply lines PL, and an initialization power supply line IPL.

The scan lines Si−1, Si, and Si+1 may extend in a first direction DR1. The scan lines Si−1, Sia and Sib may include the i−$1^{th}$ scan line Si−1, the $i^{th}$ first scan line Sia, and the $i^{th}$ second scan line Sib, sequentially arranged in a second direction DR2 crossing the first direction DR1.

A scan signal may be supplied to the scan lines Si−1, Sia, and Sib. For example, the i−$1^{th}$ scan signal may be supplied to the i−$1^{th}$ scan line Si−1, the $i^{th}$ first scan signal may be supplied to the $i^{th}$ first scan line Sia, and the $i^{th}$ second scan signal may be supplied to the $i^{th}$ second scan line Sib. The $i^{th}$ first scan signal and the $i^{th}$ second scan signal may be simultaneously supplied to the corresponding scan lines.

The emission control line Ei extends in the first direction DR1, is disposed between the $i^{th}$ first scan line Sia and the $i^{th}$ second scan line Sib, and is spaced apart from the $i^{th}$ first scan line Sia and the $i^{th}$ second scan line Sib. An emission control signal is supplied to the emission control line Ei.

The data lines Dj may extend in the second direction DR2 and a data signal may be supplied to the data line Dj. The power supply line PL may extend in the second direction DR2. The power supply line PL may be spaced apart from the data line Dj. The first power supply ELVDD may be supplied to the power supply line PL.

The initialization power supply line IPL may extend in the first direction DR1. The initialization power supply line IPL may be provided between the $i^{th}$ second scan line Sib and the i−$1^{th}$ scan line Si−1 of the pixel in the next row. An initialization power supply Vint may be supplied to the initialization power supply line IPL.

The pixels PXL may include a light emitting device OLED, which emits light, and a pixel circuit PC for driving the light emitting device OLED. The pixel circuit PC may include first to seventh transistors T1 to T7, and a storage capacitor Cst.

In an exemplary embodiment, the first to third transistors T1 to T3 and the fifth and sixth transistors T5 and T6 may be formed of P type thin film transistors. The fourth transistor T4 and the seventh transistor T7 may be formed of N-type thin film transistors.

The first transistor T1 may include the first gate electrode GE1, the first active pattern ACT1, the first source electrode SE1, the first drain electrode DE1, and the first connection line CNL1. The first gate electrode GE1 may be connected to both the third drain electrode DE3 of the third transistor T3 and the fourth drain electrode DE4 of the fourth transistor T4.

The first connection line CNL1 may connect among the first gate electrode GE1, the third drain electrode DE3, and the fourth drain electrode DE4. One end of the first connection line CNL1 may be connected to the first gate electrode GE1 through the first contact hole CH1, and the other end thereof may be connected to both the third drain electrode DE3 and the fourth source electrode SE4 through the second contact hole CH2.

In an exemplary embodiment, the first active pattern ACT1, the first source electrode SE1, and the first drain electrode DE1 may be formed of a semiconductor layer not doped with impurity or doped with impurity.

For example, the first source electrode SE1 and the first drain electrode DE1 may be formed of a semiconductor layer doped with impurity, and the first active pattern ACT1 may be formed of a semiconductor layer not doped with impurity. As used herein, the impurity may include a p-type impurity.

The first active pattern ACT1 has a bar shape extending in a predetermined direction and may have a shape bent multiple times in the extended longitudinal direction. The first active pattern ACT1 may overlap the first gate electrode GE1 in a plane view. Since the first active pattern ACT1 is formed long, a channel region of the first transistor T1 may also be formed long.

Accordingly, a driving range of a gate voltage supplied to the first transistor T1 is widened. Therefore, a gray scale of light emitted from the organic light emitting diode OLED may be finely controlled.

The first source electrode SE1 may be connected to one end of the first active pattern ACT1. In addition, the first source electrode SE1 may be connected to the second drain electrode DE2 of the second transistor T2 and the fifth drain electrode DE5 of the fifth transistor T5. The first drain electrode DE1 may be connected to the other end of the first active pattern ACT1. In addition, the first drain electrode DE1 may be connected to the third source electrode SE3 of the third transistor T3 and the sixth source electrode SE6 of the sixth transistor T6.

The second transistor T2 may include the second gate electrode GE2, the second active pattern ACT2, the second source electrode SE2, and the second drain electrode DE2. The second gate electrode GE2 may be connected to the $i^{th}$ first scan line Sia. The second gate electrode GE2 may be provided in a portion of the $i^{th}$ first scan line Sia or in a shape protruding from the $i^{th}$ first scan line Sia.

In an exemplary embodiment, the second active pattern ACT2, the second source electrode SE2, and the second drain electrode DE2 may be formed of a semiconductor layer not doped with impurity or doped with impurity.

For example, the second source electrode SE2 and the second drain electrode DE2 may be formed of a semiconductor layer doped with impurity, and the second active pattern ACT2 may be a semiconductor layer not doped with the impurity. The impurity may include a p-type impurity.

The second active pattern ACT2 corresponds to a portion overlapping the second gate electrode GE2. One end of the second source electrode SE2 is connected to the second active pattern ACT2, and the other end thereof is connected to the data line Dj through the sixth contact hole CH6. One end of the second drain electrode DE2 is connected to the second active pattern ACT2, and the other end thereof is connected to the first source electrode SE1 of the first transistor T1 and the fifth drain electrode DE5 of the fifth transistor T5.

The third transistor T3 may be provided with a double gate structure to prevent a leakage current. That is, the third transistor T3 may include the third-a transistor T3a and the third-b transistor T3b. The third-a transistor T3a may include the third-a gate electrode GE3a, the third-a active pattern ACT3a, the third-a source electrode SE3a, and the third-a drain electrode DE3a. The third-b transistor T3b may include the third-b gate electrode GE3b, the third-b active pattern ACT3b, the third-b source electrode SE3b, and the third-b drain electrode DE3b.

In an exemplary embodiment, for convenience of description, the third-a gate electrode GE3a and the third-b gate electrode GE3b are referred to as the third gate electrode GE3, the third-a active pattern ACT3a and the third-b active pattern ACT3b are referred to as the third active pattern ACT3, the third-a source electrode SE3a and the third-b source electrode SE3b are referred to as the third source electrode SE3, and the third-a drain electrode DE3a and the third-b drain electrode DE3b are referred to as the third drain electrode DE3.

The third gate electrode GE3 may be connected to the $i^{th}$ first scan line Sia. The third gate electrode GE3 is provided in a portion of the $i^{th}$ first scan line Sia or in a shape protruding from the $i^{th}$ first scan line Sia.

The third active pattern ACT3, the third source electrode SE3, and the third drain electrode DE3 may be formed of a semiconductor layer not doped with impurity or doped with impurity. For example, the third source electrode SE3 and the third drain electrode DE3 may be formed of a semiconductor layer doped with impurity, and the third active pattern ACT3 may be formed of a semiconductor layer not doped with impurity. The third active pattern ACT3 corresponds to a portion overlapping the third gate electrode GE3. The impurity may include a p-type impurity.

One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth source electrode SE4 of the fourth transistor T4. In addition, the third drain electrode DE3 may be connected to the first gate electrode GE1 of the first transistor T1 through the first connection line CNL1, the second contact hole CH2, and the first contact hole CH1.

The fourth transistor T4 may be provided with a double gate structure to prevent a leakage current. More particularly, the fourth transistor T4 may include the fourth-a transistor T4a and the fourth-b transistor T4b.

The fourth-a transistor T4a may include the fourth-a gate electrode GE4a, the fourth-a active pattern ACT4a, the fourth-a source electrode SE4a, and the fourth-a drain electrode DE4a. The fourth-b transistor T4b may include the fourth-b gate electrode GE4b, the fourth-b active pattern ACT4b, the fourth-b source electrode SE4b, and the fourth-b drain electrode DE4b.

In an exemplary embodiment, for convenience of description, the fourth-a gate electrode GE4a and the fourth-b gate electrode GE4b are referred to as the fourth gate electrode GE4, the fourth-a active pattern ACT4a and the fourth-b active pattern ACT4b are referred to as the fourth active pattern ACT4, the fourth-a source electrode SE4a and the fourth-b source electrode SE4b are referred to as the fourth source electrode SE4, and the fourth-a drain electrode DE4a and the fourth-b drain electrode DE4b are referred to as the fourth drain electrode DE4.

The fourth gate electrode GE4 may be connected to the $i-1^{th}$ scan line Si-1. The fourth gate electrode GE4 may be provided in a portion of the $i-1^{th}$ scan line Si-1 or in a shape protruding from the $i-1^{th}$ scan line Si-1. The fourth active pattern ACT4, the fourth source electrode SE4, and the fourth drain electrode DE4 may be formed of a semiconductor layer not doped with impurity or doped with impurity.

For example, the fourth source electrode SE4 and the fourth drain electrode DE4 may be formed of a semiconductor layer doped with impurity, and the fourth active pattern ACT4 may be formed of a semiconductor layer not doped with impurity. The fourth active pattern ACT4 corresponds to a portion overlapping the fourth gate electrode GE4. The impurity may include an n-type impurity.

One end of the fourth drain electrode DE4 may be connected to the fourth active pattern ACT4. The other end of the fourth drain electrode DE4 may be connected to the initialization power supply line IPL of the pixel PXL in the $i-1^{th}$ row and the seventh drain electrode DE7 of the seventh transistor T7 of the pixel PXL in the $i-1^{th}$ row.

An auxiliary connection line AUX may be provided between the fourth drain electrode DE4 and the initialization power supply line IPL.

One end of the auxiliary connection line AUX may be connected to the fourth drain electrode DE4 through the ninth contact hole CH9. The other end of the auxiliary connection line AUX may be connected to the initialization power supply line IPL of the pixel PXL in the $i-1^{th}$ row through the eighth contact hole CH8 of the pixel PXL in the $i-1^{th}$ row.

One end of the fourth source electrode SE4 may be connected to the fourth active pattern ACT4. The other end of the fourth source electrode SE4 may be connected to the third drain electrode DE3 of the third transistor T3. Specifically, the fourth-b source electrode SE4b included in the fourth source electrode SE4 is connected to the third-b drain electrode DE3b included in the third drain electrode DE3.

In addition, the fourth source electrode SE4 is connected to the first gate electrode GE1 of the first transistor T1 through the first connection line CNL1, the second contact hole CH2, and the first contact hole CH1.

The fifth transistor T5 may include the fifth gate electrode GE5, the fifth active pattern ACT5, the fifth source electrode SE5, and the fifth drain electrode DE5. The fifth gate electrode GE5 may be connected to the emission control line Ei. The fifth gate electrode GE5 may be provided in a portion of the emission control line Ei or may be provided in a shape protruding from the emission control line Ei.

The fifth active pattern ACT5, the fifth source electrode SE5, and the fifth drain electrode DE5 may be formed of a semiconductor layer not doped with impurity or doped with impurity. For example, the fifth source electrode SE5 and the fifth drain electrode DE5 may be formed of a semiconductor layer not doped with impurity. The fifth active pattern ACT5 corresponds to a portion overlapping the fifth gate electrode GE5. The impurity may include a p-type impurity.

One end of the fifth source electrode SE5 may be connected to the fifth active pattern ACT5. The other end of the fifth source electrode SE5 may be connected to the power supply line PL through the fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include the sixth gate electrode GE6, the sixth active pattern ACT6, the sixth source electrode SE6, and the sixth drain electrode DE6. The sixth gate electrode GE6 may be connected to the emission control line Ei. The sixth gate electrode GE6 may be provided in a portion of the emission control line Ei or may be provided in a shape protruding from the emission control line Ei.

The sixth active pattern ACT6, the sixth source electrode SE6, and the sixth drain electrode DE6 are formed of a semiconductor layer, to which impurity is not doped or impurity is doped. For example, the sixth source electrode SE6 and the sixth drain electrode DE6 may be formed of a semiconductor layer doped with the impurity, and the sixth active pattern ACT6 may be formed of a semiconductor layer not doped with the impurity. The sixth active pattern ACT6 corresponds to a portion overlapping the sixth gate electrode GE6. Herein, the impurity may include a p-type impurity.

One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include the seventh gate electrode GE7, the seventh active pattern ACT7, the seventh source electrode SE7, and the seventh drain electrode DE7. The seventh gate electrode GE7 may be connected to the $i^{th}$ second scan line Sib. The seventh gate electrode GE7 may be provided in a portion of the $i^{th}$ second scan line Sib or in a shape protruding from the $i^{th}$ second scan line Sib.

The seventh active pattern ACT7, the seventh source electrode SE7, and the seventh drain electrode DE7 may be formed of a semiconductor layer not doped with impurity or doped with impurity. For example, the seventh source electrode SE7 and the seventh drain electrode DE7 may be formed of a semiconductor layer doped with the impurity and the seventh active pattern ACT7 may be formed of a semiconductor layer not doped with the impurity. Herein, the impurity may include an n-type impurity.

The seventh active pattern ACT7 corresponds to a portion overlapping the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power supply line IPL.

In addition, the seventh drain electrode DE7 may be connected to the fourth source electrode SE4 of the fourth transistor T4 of the pixel PXL in the $i+1^{th}$ row. Specifically, the seventh drain electrode DE7 may be connected to a fourth-a drain electrode DE4a included in the fourth drain electrode DE4.

The seventh drain electrode DE7 and the fourth-a drain electrode DE4a of the fourth transistor T4 may be connected to each other through the auxiliary line AUX, the eighth contact hole CH8, and the ninth contact hole CH9.

The storage capacitor Cst may include a lower electrode LE and an upper electrode UE. The lower electrode LE may be formed of the first gate electrode GE1 of the first transistor T1. The upper electrode UE may overlap the lower electrode LE and may cover the lower electrode LE in a plane view. A capacitance of the storage capacitor Cst may increase by enlarging an overlapping area between the upper electrode UE and the lower electrode LE. The upper electrode UE may extend in the first direction DR1.

In an exemplary embodiment, a voltage of the same level as a voltage of the first power supply ELVDD may be supplied to the upper electrode UE. The upper electrode UE may have an opening OPN in a region where the first contact hole CH1, through which the first gate electrode GE1 and the first connection line CNL1 are connected, is formed.

The light emitting device OLED may include the first electrode AD, the second electrode CD, and an emission layer EML provided between the first electrode AD and the second electrode CD.

The first electrode AD may be provided in an emission region corresponding to the pixel PXL. The first electrode AD may be connected to the seventh source electrode SE7 of the seventh transistor T7 and the sixth drain electrode DE6 of the sixth transistor T6 through the seventh contact hole CH7, the tenth contact hole CH10, and the eleventh contact hole CH11.

The second connection line CNL2 and a bridge pattern BRP may be provided between the seventh contact hole CH7 and the tenth contact hole CH10, so that the sixth drain electrode DE6 and the seventh source electrode are connected to the first electrode AD.

Meanwhile, the pixel PXL may be divided into a first region A1 including a semiconductor layer doped with the n-type impurity, and a second region A2 excluding the first region A1. The second region A2 may include a semiconductor layer doped with the p-type impurity.

In a plan view, the fourth transistor T4 and the seventh transistor T7 may be provided in the first region A1. In addition, the first to third transistors T1 to T3 and the fifth and sixth transistors T5 and T6 may be provided in the second region A2 in a plan view.

The first contact portion CNP1 and the second contact portion CNP2 may be disposed between the first region A1 and the second region A2.

In an exemplary embodiment, the first contact portion CNP1 may refer to a region where the third-b drain electrode DE3b doped with the p-type impurity contacts the fourth-4 source electrode SE4b doped with the n-type impurity. At this time, the third-b drain electrode DE3b and the fourth-b source electrode SE4b may be provided in the same layer on the same plane, but the inventive concepts are not limited thereto.

The first connection line CNL1 may be disposed at the first contact portion CNP1. As described above, the first connection line CNL1 may contact the third-b drain electrode DE3b and the fourth-b source electrode SE4b through the second contact hole CH2.

More specifically, one side of the lower surface of the first connection line CNL1 may contact the third-b drain electrode DE3b, and the other side of the lower surface of the first connection line CNL1 may contact the fourth-b source electrode SE4b.

In an exemplary embodiment, since the first connection line CNL1 contacts both the third-b drain electrode DE3b and the fourth-b source electrode SE4b, the size of the second contact hole CH2 may be greater than the size of other contact holes. As such, the width and/or the area of the first connection line CNL1 may be increased.

When the width and/or the area of the first connection line CNL1 is increased, the contact area of the first connection line CNL1, the third-b drain electrode DE3b, and the fourth-b source electrode SE4b may be sufficiently secured. In this case, poor contact between the third transistor T3 and the fourth transistor T4 may be minimized, so that the pixel PXL may display an image with a desired luminance.

In an exemplary embodiment, the second contact portion CNP2 may refer to a region where the sixth drain electrode DE6 doped with the p-type impurity contacts the seventh source electrode SE7 doped with the n-type impurity. At this time, the sixth drain electrode DE6 and the seventh source electrode SE7 may be provided in the same layer on the same plane, but the inventive concepts are not limited thereto.

The second connection line CNL2 may be disposed on the the second contact portion CNP2. The second connection line CNL2 may contact the sixth drain electrode DE6 and the seventh source electrode SE7 through the seventh contact hole CH7.

More specifically, one side of the lower surface of the second connection line CNL2 may contact the seventh source electrode SE7, and the other side of the lower surface of the second connection line CNL2 may contact the sixth drain electrode DE6.

In an exemplary embodiment, since the second connection line CNL2 contacts both the seventh source electrode SE7 and the sixth drain electrode DE6, the size of the seventh contact hole CH7 may be greater than the size of other contact holes. As such, the width and/or the area of the second connection line CNL2 may be increased. When the width and/or the area of the second connection line CNL2 is increased, the contact area of the second connection line CNL2, the seventh source electrode SE7, and the sixth drain electrode DE6 may be sufficiently secured. In this case, poor contact between the sixth transistor T6 and the seventh transistor T7 may be minimized, so that the pixel PXL may display an image with a desired luminance.

Hereinafter, a structure of a display device according to an exemplary embodiment will be described with reference to FIGS. 5 to 7.

A buffer layer BFL may be provided on the substrate SUB. The buffer layer BFL may prevent the impurity from diffusing into the first to seventh transistors T1 to T7. The buffer layer BFL may be provided as a single layer, or may be provided as multiple layers having at least two or more layers. When the buffer layer BFL is formed of multiple layers, each layer may be formed of the same material or may be formed of different materials. The buffer layer BFL may be omitted according to a material of the substrate SUB and a process condition.

A first to the seventh active patterns ACT1 to ACT7 may be provided on the substrate SUB. The first to the seventh active patterns ACT1 to ACT7 may be formed of a semiconductor material.

A first gate insulation layer GI may be provided on the substrate SUB on which the first to the seventh active patterns ACT1 to ACT7 are provided. The first gate insulation layer GI may be an inorganic insulation layer including an inorganic material. For example, the first gate insulation layer GI may include at least one of silicon nitride, silicon oxide, and silicon oxynitride.

The $i-1^{th}$ scan line Si-1, the $i^{th}$ first scan line Sia, the $i^{th}$ second scan line Sib, the emission control line Ei, and the first to seventh gate electrodes GE1 to GE7 may be provided on the first gate insulation layer GI.

The first gate electrode GE1 may be the lower electrode LE of the storage capacitor Cst. The second gate electrode GE2 and the third gate electrode GE3 may be formed integrally with the $i^{th}$ first scan line Sia. Since the third gate electrode GE3 includes the third-a gate electrode GE3a and the third-b gate electrode GE3b, the third-a gate electrode GE3a and the third-b gate electrode GE3b may be formed integrally with the $i^{th}$ first scan line Sia.

The fourth gate electrode GE4 may be formed integrally with the $i-1^{th}$ scan line Si-1. Since the fourth gate electrode GE4 includes the fourth-a gate electrode GE4a and the fourth-b gate electrode GE4b, the fourth-a gate electrode GE4a and the fourth-b gate electrode GE4b may be formed integrally with the $i-1^{th}$ scan line Si-1.

The seventh gate electrode GE7 may be formed integrally with the $i^{th}$ second scan line Sib. The fifth gate electrode GE5 and the sixth gate electrode GE6 may be formed integrally with the emission control line Ei. A second gate insulation layer GI2 may be provided on the substrate SUB, on which the scan lines Si-1, Sia, and Sib are provided.

The upper electrode UE of the storage capacitor Cst and the initialization power supply line IPL may be provided on the second gate insulation layer GI2. The upper electrode UE may cover the lower electrode LE. The upper electrode UE may form the storage capacitor Cst together with the lower electrode LE with the second gate insulation layer GI2 interposed therebetween.

The first interlayer insulation layer ILD1 may be provided on the substrate SUB, on which the upper electrode UE and the initialization power supply line IPL are disposed.

The first and second connection lines CNL1 and CNL2, the auxiliary connection line AUX, the data line Dj, and the power supply line PL may be provided on the first interlayer insulation layer ILD1.

The first connection line CNL1 may be connected to the first gate electrode GE1 through the first contact hole CH1 sequentially passing through the first interlayer insulation layer ILD1 and the second gate insulation layer GI2. In addition, the first connection line CNL1 may be connected to the third-b drain electrode DE3b and the fourth-b source electrode DE4b through the second contact hole CH2 sequentially passing through the first and second gate insulation layers GI1 and GI2, and the first interlayer insulation layers ILD1. At this time, the size of the second contact hole CH2 may be greater than the size of the first contact hole CH1.

The second connection line CNL2 may be a pattern provided as a medium connecting the sixth drain electrode DE6 and the first electrode AD between the sixth drain electrode DE6 and the first electrode AD. The second connection line CNL2 may be connected to the sixth drain electrode DE6 and the seventh source electrode SE7 through the seventh contact hole CH7 sequentially passing through the first and second gate insulation layers GI1 and GI2, and the first interlayer insulation layer ILD1. At this time, the size of the seventh contact hole CH7 may be greater than the size of the first contact hole CH1.

The auxiliary connection line AUX may be connected to the initialization power supply line IPL through the eighth contact hole CH8 passing through the first interlayer insulation layer ILD1. In addition, the auxiliary connection line AUX may be connected to the fourth-a drain electrode DE4a and the seventh drain electrode DE7 of the pixel PXL in the row through the ninth contact hole CH9 sequentially passing through the first and second gate insulation layers GI1 and GI2, and the first interlayer insulation layer ILD1.

The data line Dj may be connected to the second source electrode SE2 through the sixth contact hole CH6 sequentially passing through the first and second gate insulation layers GI1 and GI2, and the first interlayer insulation layer ILD1.

The power supply line PL may be connected to the upper electrode UE through the third and fourth contact holes CH3 and CH4 passing through the first interlayer insulation layer ILD1. In addition, the power supply line PL may be connected to the fifth source electrode SE5 through the fifth contact hole CH5 sequentially passing through the first and second gate insulation layers GI1 and GI2, and the first interlayer insulation layer ILD1.

A second interlayer insulation layer ILD2 may be provided on the first and second connection lines CNL1 and CNL2, the auxiliary connection line AUX, the data line Dj, and the power supply line PL. The second interlayer insulation layer ILD2 may be an inorganic insulation layer including an inorganic material or an organic insulation layer including an organic material.

In an exemplary embodiment, the second interlayer insulation layer ILD2 may be an organic insulation layer. The second interlayer insulation layer ILD2 may be formed as a single layer, but the inventive concepts are not limited thereto, and may be formed of multiple layers.

When the second interlayer insulation layer ILD2 is formed of multiple layers, the second interlayer insulation layer ILD2 may have a structure in which a plurality of inorganic insulation layers or a plurality of organic insulation layers are alternately stacked. For example, the second interlayer insulation layer ILD2 may have a structure in which the first organic insulation layer, an inorganic insulation layer, and the second organic insulation layer are sequentially stacked.

The bridge pattern BRP may be provided on the second interlayer insulation layer ILD2. The bridge pattern BRP may be connected to the second connection line CNL2 through the tenth contact hole CH10 passing through the second interlayer insulation layer ILD2.

A passivation layer PSV may be provided on the bridge pattern BRP.

The first electrode AD may be provided on the passivation layer PSV. The first electrode AD may be connected to the bridge pattern BRP through the eleventh contact hole CH11 passing through the passivation layer PSV.

Since the bridge pattern BRP is connected to the second connection line CNL2 through the tenth contact hole CH10, the first electrode AD may be connected to the sixth drain electrode DE6 and the seventh source electrode SE7 through the bridge pattern BRP and the second connection line CNL2.

A pixel definition layer PDL may be provided on the substrate SUB on which the first electrode AD is formed to define an emission region corresponding to each pixel PXL. The pixel definition layer PDL may expose the top surface of the first electrode AD and may protrude from the substrate SUB along the periphery of the pixel PXL.

An emission layer EML may be provided on the exposed upper surface of the first electrode AD. The second electrode CD may be provided on the emission layer EML.

The pixel definition layer PDL may include an organic insulation layer. For example, the pixel definition layer PDL may include at least one of polystyrene, polymethylmethacrylate (PMMA), polyacrylonitrile (PAN), polyamide (PA), polyimide(PI), polyarylether (PAE), heterocyclic polymer, parylene, epoxy, benzocyclobutene (BCB), siloxane based resin, and silane based resin.

The emission layer EML may be disposed on the exposed surface of the first electrode AD. The emission layer EML may have a multiple thin layer structure including at least one light generation layer. For example, the emission layer EML may include a hole injection layer for injecting holes having excellent transportability, a hole transport layer for increasing a chance of recombination of holes and electrons by blocking a movement of electrons which are not coupled in the light generating layer, the light generating layer which emits light by recombination of injected electrons and holes, a hole blocking layer for blocking a movement of holes which are not coupled in the light generating layer, an electron transport layer for smoothly transporting electrons to the light generating layer, and an electron injection layer for injecting electrons.

The color of light generated in the light generating layer may be one of red, green, blue, and white, but the inventive concepts are not limited thereto. For example, the color of light generated in the light generating layer of the emission layer EML may be one of magenta, cyan, and yellow. Each of the hole injection layer, the hole transport layer, the hole blocking layer, the electron transport layer, and the electron injection layer may be a common layer connected to each other in adjacent emission regions.

A thin film encapsulation film TFE covering the second electrode CD may be provided on the second electrode CD. The thin film encapsulation film TFE may be made of a single layer or may be made of multiple layers. The thin film encapsulation film TFE may include a plurality of insulation layers covering the light emitting device OLED. Specifically, the thin film encapsulation film TFE may include a plurality of inorganic layers and a plurality of organic layers. For example, the thin film encapsulation film TFE may have a structure in which the inorganic layer and the organic layer are alternately stacked. In addition, the thin film encapsulation film TFE may be an encapsulation substrate disposed on the light emitting device OLED and bonded to the substrate SUB by using a sealant.

Meanwhile, the display device according to an exemplary embodiment may further include a touch sensor provided on the thin film encapsulation film TFE. The touch sensor may be disposed on a surface in a direction to which an image of the substrate SUB is emitted to receive a user's touch input. The touch event to the display device may be recognized by using a hand of the user of the touch sensor or a separate input means.

The touch sensor may be driven by a mutual capacitance method. The mutual capacitance method senses a capacitance change due to an interaction between two touch sensing electrodes. In addition, the touch sensor may be driven by a self capacitance method. The self capacitance method senses a capacitance change of a sensing electrode of a touched region when a user touches the sensing electrode by using touch sensing electrodes arranged in a matrix and sensing lines connected to each of the touch sensing electrodes.

The touch sensor may include the touch sensing electrode, the sensing line connected to the touch sensing electrode, and a pad unit connected to an end of the sensing line.

A window may be provided on the touch sensor to protect the exposed surface of the touch sensor. The window transmits an image from the substrate SUB and alleviates an external impact, thereby preventing the display device from being broken or malfunctioning due to the external impact.

FIGS. 8 to 19 are cross-sectional views sequentially showing a manufacturing method of the display device shown in FIG. 5.

First, referring to FIGS. 5 to 8, a substrate SUB may be provided.

The substrate SUB may be formed of a transparent glass material including silicon dioxide ($SiO_2$) as a main component. The substrate SUB is not necessarily limited thereto, but may be formed of a transparent plastic material.

After a semiconductor material layer is deposited on the substrate SUB, a mask process is performed to form a semiconductor layer SCL. The semiconductor material layer may be formed of silicon (Si), such as amorphous silicon (a-Si) or polysilicon (p-Si). When the semiconductor material layer is formed of amorphous silicon (a-Si), a crystallization process may be further performed using a laser or the like.

According to an exemplary embodiment, the semiconductor material layer may be formed of a semiconductor oxide including a binary compound (ABx), a ternary compound (ABxCy), a quarternary compound (ABxCyDz), and the like and including indium(In), zinc(Zn), gallium(Ga), tin(Sn), titanium(Ti), aluminum(Al), hafnium (Hf), zirconium (Zr), magnesium(Mg), and the like. These may be used alone or in combination with each other.

Referring to FIGS. 5 to 9, a semiconductor layer SCL1 (hereinafter, referred to as 'first semiconductor layer') of a P-type thin film transistor is formed by doping the semiconductor layer SCL with an impurity including boron or the like. The first semiconductor layer SCL1 may be a semiconductor layer of each of the first to third transistors T1 to T3, and the fifth and sixth transistors T5 and T6.

Referring to FIGS. 5 to 10, a photoresist pattern is formed on the substrate SUB including the first semiconductor layer SCL1. The photoresist pattern may cover the first semiconductor layer SCL1 and expose the semiconductor layer SCL to the outside.

Next, a semiconductor layer SCL2 (hereinafter, referred to as 'second semiconductor layer') of an N-type thin film transistor is formed by doping the exposed semiconductor layer SCL with an impurity including boron or the like. The second semiconductor layer SCL2 may be a semiconductor layer of each of the fourth and seventh transistors T4 and T7.

The first semiconductor layer SCL1 and the second semiconductor layer SCL2 may be on the same plane and may be formed on the same layer. According to an exemplary embodiment, the boundary between the first semiconductor layer SCL1 and the second semiconductor layer SCL2 may not be clearly divided, or the boundary may be clearly divided.

Next, the photoresist pattern is removed from the substrate SUB.

Referring to FIGS. 5 to 11, a first gate insulation layer GI1 may be formed on the first and second semiconductor layers SCL1 and SCL2. The first gate insulation layer GI1 may be an inorganic insulation layer including an inorganic material.

A first conductive material layer is deposited on the first gate insulation layer GI1, and a lower electrode LE, an emission control line Ei, an $i^{th}$ first scan line Sia, and a conductive pattern CP are formed by using a mask process. Herein, the lower electrode LE may include a first gate electrode GE1, the emission control line Ei may include a fifth and sixth gate electrodes GE5 and GE6, and the $i^{th}$ first scan line Sia may include a third-a and third-b gate electrodes GE3a and GE3b.

In an exemplary embodiment, the conductive pattern CP may be provided on the second semiconductor layer SCL2 to cover the second semiconductor layer SCL2.

Referring to FIGS. 5 to 12, by using the lower electrode LE, the emission control line Ei, the $i^{th}$ first scan line Sia, and the conductive pattern CP as a mask, the first semiconductor layer SCL1 is doped with a high concentration p-type impurity. Herein, the p-type impurity may include aluminum, gallium, indium, boron, and the like, which have three outermost electrons.

At this time, the second semiconductor layer SCL2 may be covered with the conductive pattern CP. Therefore, the p-type impurity may not be doped in the second semiconductor layer SCL2.

The first, second, third-a, third-b, fifth, and sixth source electrode SE1, SE2, SE3a, SE3b, SE5, and SE6 having conductivity may be formed by doping the first semiconductor layer SCL1 with a p-type impurity at high concentration. At the same time, the first, second, third-a, third-b, fifth and sixth drain electrodes DE1, DE2, DE3a, DE3b, DE5, and DE6 may be formed.

Due to the first gate electrode GE1, the first semiconductor layer SCL1, may become a first active pattern ACT1, which is not doped with a p-type impurity at a high concentration. The first active pattern ACT1 may be a channel of the first transistor T1. Therefore, the first gate electrode GE1, the first active pattern ACT1, the first source electrode SE1, and the first drain electrode DE1 may constitute the first transistor T1, which is a P-type thin film transistor.

Due to the second gate electrode GE2, the first semiconductor layer SCL1 may become a second active pattern ACT2, which is not doped with a p-type impurity at a high concentration. The second active pattern ACT2 may be a channel of the second transistor T2. Therefore, the second gate electrode GE2, the second active pattern ACT2, the second source electrode SE2, and the second drain electrode DE2 may constitute the second transistor T2, which is a P-type thin film transistor.

Due to the third-a gate electrode GE3a, the first semiconductor layer SCL1 may become the third-a active pattern ACT3a, which is not doped with the p-type impurity at a high concentration. The third-a active pattern ACT3a may be a channel of the third-3 transistor T3a. Therefore, the third-a gate electrode GE3a, the third active pattern ACT3a, the third-a source electrode SE3a, and the third-a drain electrode DE3a may constitute the third-a transistor T3a, which is a P-type thin film transistor.

Due to the third-b gate electrode GE3b, the first semiconductor layer SCL1 may become the third-b active pattern ACT3b, which is not doped with a p-type impurity at a high concentration. The third-b active pattern ACT3b may be a channel of the third transistor T3b. Therefore, the third-b gate electrode GE3b, the third-b active pattern ACT3b, the third-b source electrode SE3b, and the third-b drain electrode DE3b may constitute the third-b transistor T3b, which is a P-type thin film transistor.

Due to the fifth gate electrode GE5, the first semiconductor layer SCL1, may become the fifth active pattern ACT5 which is not doped with a p-type impurity at a high concentration. The fifth active pattern ACT5 may be a channel of the fifth transistor T5. Therefore, the fifth gate electrode GE5, the fifth active pattern ACT5, the fifth source electrode SE5, and the fifth drain electrode DE5 may constitute the fifth transistor T5, which is a P-type thin film transistor.

Due to the sixth gate electrode GE6, the first semiconductor layer SCL1 may become the sixth active pattern ACT6, which is not doped with a p-type impurity at a high concentration,. The sixth active pattern ACT6 may be a channel of the sixth transistor T6. Therefore, the sixth gate electrode GE6, the sixth active pattern ACT6, the sixth source electrode SE6, and the sixth drain electrode DE6 may constitute the sixth transistor T6, which is a P-type thin film transistor.

Referring to FIGS. 5 to 13, a photoresist pattern is formed on the substrate SUB on which the emission control line Ei is formed.

The photoresist pattern may cover the first to third transistors T1 to T3, the fifth and sixth transistors T5 and T6, the emission control line Ei, and the $i^{th}$ first scan line Sia, and may partially expose the conductive pattern CP.

Next, a mask process is performed to pattern the conductive pattern CP, thereby forming the $i-1^{th}$ scan line Si−1 and the $i^{th}$ second scan line Sib. The $i-1^{th}$ scan line Si−1 may include the fourth-a and fourth-b gate electrodes GE4a and GE4b, and the $i^{th}$ second scan line Sib may include a seventh gate electrode GE7.

Next, the second semiconductor layer SCL2 is doped with an n-type impurity at a high concentration by using the $i-1^{th}$ scan line Si−1 and the i$^{th}$ second scan line Sib as a mask. Herein, the n-type impurity may include phosphorus, arsenic, antimony, and the like, which have five outermost electrons.

At this time, the first to third transistors T1 to T3 and the fifth and sixth transistors T5 and T6 may be covered by the photoresist pattern. Therefore, the semiconductor layers of each of the first to third transistors T1 to T3 and the fifth and fifth transistors T5 and T6 may not be doped with the n-type impurity.

Since the second semiconductor layer SCL2 is doped with the n-type impurity at a high concentration, the fourth-a, fourth-b, and seventh source electrodes SE4a, SE4b, and SE7 having conductivity may be formed, and at the same time, the fourth-a, fourth-b, and seventh drain electrodes DE4a, DE4b, and DE7 may be formed.

Due to the fourth-a gate electrode GE4a, the second semiconductor layer SCL2 may become the fourth-a active pattern ACT4a, which is not doped with the n-type impurity at a high concentration. The fourth-a active pattern ACT4a may be a channel of the fourth-a transistor T4a. Therefore, the fourth-a gate electrode GE4a, the fourth-a active pattern ACT4a, the fourth-a source electrode SE4a, and the fourth-a drain electrode DE4a may constitute the fourth-a transistor T4a, which is an N-type thin film transistor.

Due to the fourth-b gate electrode GE4b, the second semiconductor layer SCL2 may become the fourth-b active pattern ACT4b, which is not doped with the n-type impurity at a high concentration. The fourth-b active pattern ACT4b may be a channel of the fourth-b transistor T4b. Therefore, the fourth-b gate electrode GE4b, the fourth-b active pattern ACT4b, the fourth-b source electrode SE4b, and the fourth-b drain electrode DE4b may constitute the fourth-b transistor T4b, which is an N-type thin film transistor.

Due to the seventh gate electrode GE7, the second semiconductor layer SCL2 may become the seventh active pattern ACT7, which is not doped with the n-type impurity at a high concentration. The seventh active pattern ACT7 may be a channel of the seventh transistor T7. Therefore, the seventh gate electrode GE7, the seventh active pattern ACT7, the seventh source electrode SE7, and the seventh drain electrode DE7 may constitute the seventh transistor T7, which is an N-type thin film transistor.

Herein, the sixth drain electrode DE6 and the seventh source electrode SE7, which are doped with different impurities, may be adjacent to each other. In addition, the third-b drain electrode DE3b and the fourth-b source electrode SE4b, which are doped with different impurities, may be adjacent to each other.

After injecting the n-type impurity, the photoresist pattern on the substrate SUB is removed.

Referring to FIGS. 5 to 14, a second gate insulating layer GI2 may be formed on the substrate SUB on which the seventh transistor T7 and the like are formed. The second gate insulation layer GI2 may be an inorganic insulation layer including an inorganic material.

After a second conductive material layer is deposited on the second gate insulation layer GI2, a masking process may be performed to form an initialization power supply line IPL and an upper electrode UE.

Referring to FIGS. 5 to 15, after an insulation material layer may be deposited on the substrate SUB on which the upper electrode UE is formed, a masking process may be performed to form a first interlayer insulation layer ILD1.

The first interlayer insulation layer ILD1 may include an eighth contact hole CH8 exposing a portion of the initialization power supply line IPL1. In addition, the first interlayer insulation layer ILD1 may include a seventh contact hole CH7 exposing the seventh source electrode SE7 and the sixth drain electrode DE6 adjacent to each other.

In addition, the first interlayer insulation layer ILD1 may include the second contact hole CH2 exposing the third-b drain electrode DE3b and the fourth-b source electrode SE4b adjacent to each other.

Subsequently, after a third conductive material layer is deposited on the first interlayer insulation layer ILD1, a mask process may be performed to form a first and second connection lines CNL1 and CNL2, a power supply line PL, an auxiliary connection line AUX, and a data line Dj.

The first connection line CNL1 may contact the third-b drain electrode DE3b and the fourth-b source electrode SE4b doped with different impurities through the second contact hole CH2. The second connection line CNL2 may contact the sixth drain electrode DE6 and the seventh source electrode SE7 doped with different impurities through the seventh contact hole CH7. The auxiliary connection line AUX may contact the initialization power supply line IPL through the eighth contact hole CH8.

Referring to FIGS. 5 to 16, after an insulation material layer is deposited on the substrate SUB on which the first and second connection lines CNL1 and CNL2 are formed, a mask process may be performed to form the second interlayer insulation layer ILD2. The second interlayer insulation layer ILD2 may include a tenth contact hole CH10 exposing a portion of the second connection line CNL2.

Next, after a fourth conductive material layer is deposited on the second interlayer insulation layer ILD2, a mask process may be performed to form a bridge pattern BRP. The bridge pattern BRP may contact the second connection line CNL2 through the tenth contact hole CH10.

Referring to FIGS. 5 to 17, after an insulation material layer may be deposited on the substrate SUB on which the bridge pattern BRP is formed, a mask process may be performed to form a passivation layer PSV. The passivation layer PSV may include an eleventh contact hole CH11 exposing a portion of the bridge pattern BRP.

Next, after a fifth conductive material layer is deposited on the passivation layer PSV, a mask process may be performed to form the first electrode AD. The first electrode AD may be connected to the second connection line CNL2 through the eleventh contact hole CH11.

Referring to FIGS. 5 to 18, a pixel definition layer PDL including an opening exposing a portion of the first electrode AD may be formed on the first electrode AD. Next, an emission layer EML may be formed on a surface of the first electrode AD exposed by the pixel definition layer PDL. A second electrode CD may be formed on the emission layer EML. The first electrode AD, the emission layer EML, and the second electrode CD may constitute a light emitting device OLED.

Referring to FIGS. 5 to 19, a thin film encapsulation film TFE may be formed on the substrate SUB on which the light emitting device OLED is formed.

Figure 20A:
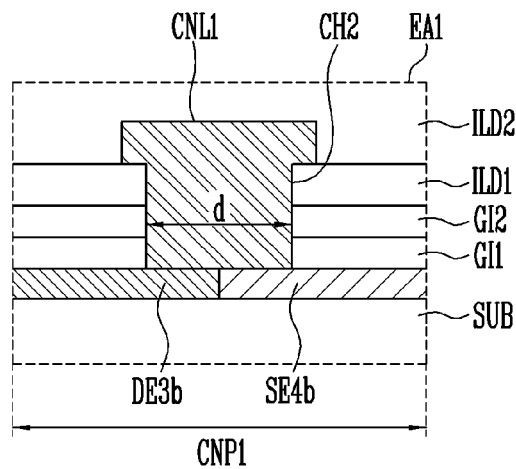
FIG. 20A is an enlarged cross-sectional view of the region EA1 of FIG. 6.
Figure 20B:
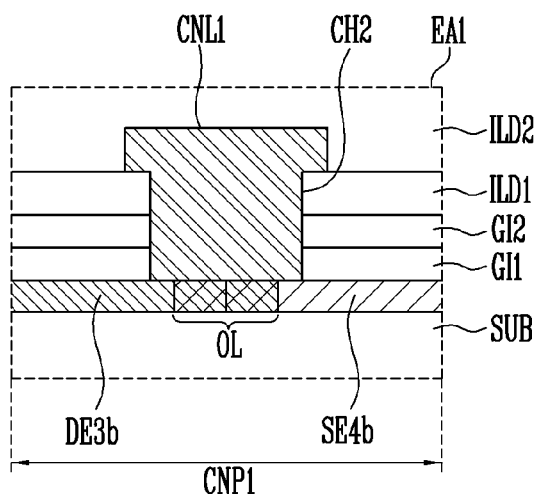
FIG. 20B and FIG. 20C are cross-sectional views corresponding to the region EA1 of FIG. 6.
Figure 20C:
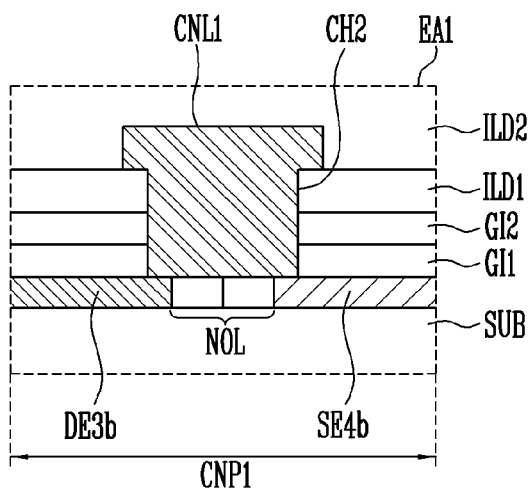

FIG. 20A is an enlarged cross-sectional view of the region EA1 of FIG. 6 according to an exemplary embodiment. FIGS. 20B and 20C are cross-sectional views of the region EA1 of FIG. 6 according to exemplary embodiments.

Referring to FIGS. 6, 20A, 20B, and 20C, the first connection line CNL1 may contact the third-b drain electrode DE3b and the fourth-b source electrode SE4b through the second contact hole CH2 at the first contact CNP1.

Specifically, one side of the lower surface of the first connection line CNL1 may contact the third-b drain electrode DE3*b*, and the other side of the lower surface of the first connection line CNL1 may contact the fourth-b source electrode SE4*b*.

As shown in FIG. 20A, the third-b drain electrode DE3*b* doped with the p-type impurity at high concentration and the fourth-b source electrode SE4*b* doped with the n-type impurity at high concentration may be provided adjacent to each other on the substrate SUB. More particularly, within the first contact portion CNP1, the fourth-b source electrode SE4*b* may be provided directly on the left side of the third-b drain electrode DE3*b*.

According to an exemplary embodiment, due to misalignment that may be occurred during the manufacturing process, an overlapping portion OL, in which a region doped with the p-type impurity and a region doped with the n-type impurity are overlapped, may be provided on the first contact portion CNP1 as shown in FIG. 20B.

In this case, one side of the lower surface of the first connection line CNL1 may contact the third-b drain electrode DE3*b*, the other side of the lower surface of the first connection line CNL1 may contact the fourth-b source electrode SE4*b*, and the center of the first connection line CNL1 between the two sides of the lower surface of the first connection line CNL1 may contact the overlapping portion OL.

The overlapping portion OL may be an electrically neutral region, in which the p-type impurity and the n-type impurity are doped. Therefore, the overlapping portion OL may not affect the electrical connection of the first connection line CNL1 to the third-b drain electrode DE3*b* and the fourth-b source electrode SE4*b*.

In addition, according to an exemplary embodiment, due to misalignment that may be occurred during the manufacturing process, an undoped region, in which the p-type impurity and the n-type impurity are not doped, may be provided at the first contact portion CNP1 as shown in FIG. 20C. The undoped region may be a non-overlapping portion NOL in which the p-type impurity and the n-type impurity are not overlapped.

In this case, one side of the lower surface of the first connection line CNL1 may contact the third-b drain electrode DE3*b*, the other side of the lower surface of the first connection line CNL1 may contact the fourth-b source electrode SE4*b*, and the center of the first connection line CNL1 between the two sides of the lower surface of the first connection line CNL1 may contact the non-overlapping portion NOL. More particularly, the first connection line CNL1 may contact the third-b drain electrode DE3*b* and the fourth-b source electrode SE4*b* with the non-overlapping portion NOL interposed therebetween.

The non-overlapping portion NOL may be an electrically neutral region, in which the p-type impurity and the n-type impurity are not doped. Therefore, the non-overlapping portion NOL may not affect the electrical connection of the first connection line CNL1 to the third-b drain electrode DE3*b* and the fourth-b source electrode SE4*b*.

Meanwhile, the second contact hole CH2 may be formed to have at least a predetermined width so that the first connection line CNL1 may stably contact the third-b drain electrode DE3*b* and the fourth-b source electrode SE4*b*.

The second contact hole CH2 may be formed to have at least a predetermined width in consideration of cases when the first connection line CNL1 contacts only the third-b drain electrode DE3*b* and the fourth-b source electrode SE4*b*, when the first connection line CNL1 also contacts the overlapping portion OL, and when the second connection line CNL1 also contacts the non-overlapping portion NOL.

In addition, when determining a predetermined width of the second contact hole CH2, it can also be taken into account that the second contact hole CH2 may be biased by the third-b drain electrode DE3*b* or by the fourth-b source electrode SE4*b* during manufacturing problems.

According to an exemplary embodiment, the width "d" of the second contact hole CH2 may be about 0.2 μm to 3 μm, but the inventive concepts are not limited thereto.

As described above, since the second contact hole CH2 is formed to have at least a predetermined width, the size of the second contact hole CH2 may be greater than other contact holes, for example, the first contact hole CH1. Thus, the width and/or the area of the first connection line CNL1 may be increased. When the width and/or the area of the first connection line CNL1 becomes large, the contact areas of the first connection line CNL1, the third-b drain electrode DE3*b*, and the fourth-b source electrode SE4*b* may be sufficiently secured.

In an exemplary embodiment, since the seventh contact hole CH7 may be formed in substantially the same method as that forming the second contact hole CH2, detailed descriptions thereof will be omitted to avoid redundancy.

Hereinafter, a current characteristic of a pixel according to an exemplary embodiment will be described with reference to FIGS. 21A and 21B.

Figure 21A:
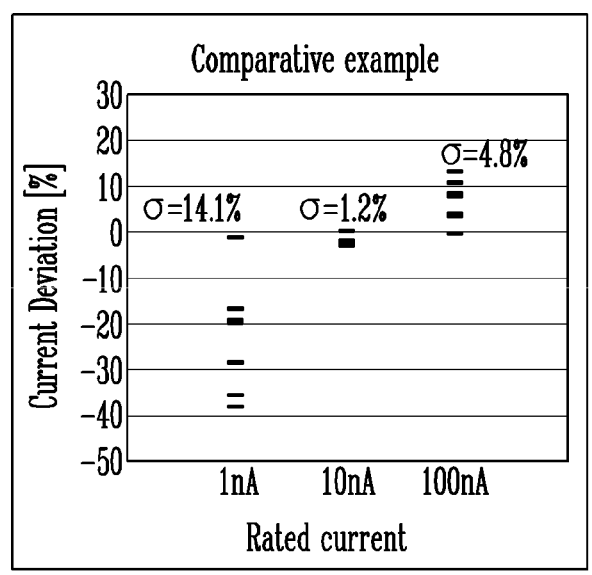
FIG. 21A and FIG. 21B are graphs showing current characteristics of an existing pixel and a pixel, respectively, according to an exemplary embodiment.
Figure 21B:
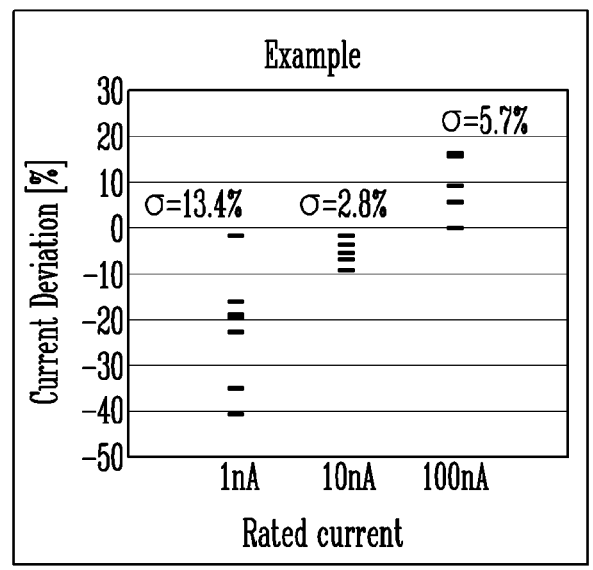

FIGS. 21A and 21B are graphs showing current characteristics of a conventional pixel and a pixel according to an exemplary embodiment. In FIG. 21A, Comparative Example shows current characteristics of conventional pixels including seven P-type thin film transistors, and Example shows current characteristics of a pixel according to an exemplary embodiment.

Referring to FIG. 21B, it can be confirmed that a current deviation according to a rated current in Example is similar to a current deviation according to a rated current in Comparative Example. Therefore, it can be confirmed that even though Example include different type of thin film transistors, Example can have similar current characteristics to current characteristics in pixels including the same type of thin film transistors.

Figure 22:
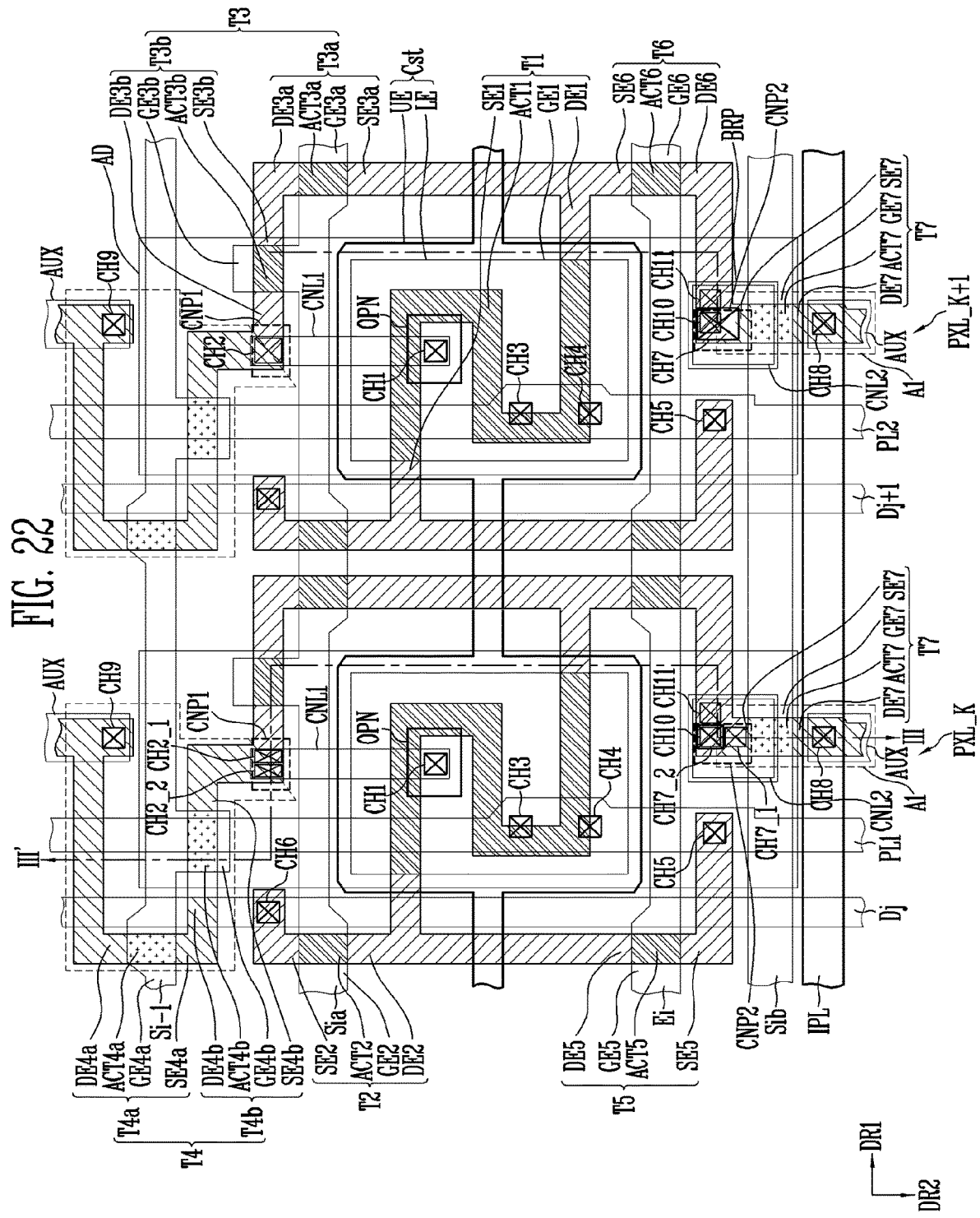
FIG. 22 is an enlarged plan view of two pixels included in the display device according to another exemplary embodiment.
Figure 23:
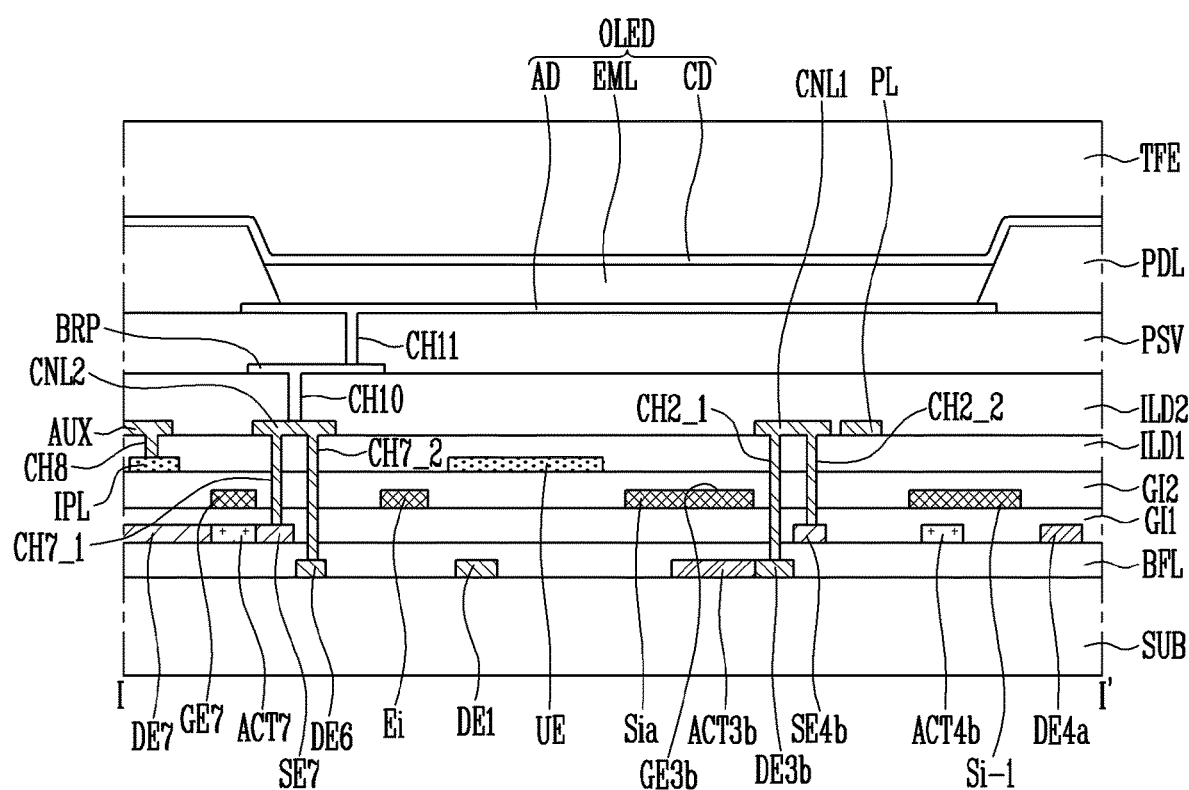
FIG. 23 is a cross-sectional view taken along line of FIG. 22.

FIG. 22 is an enlarged plan view of two pixels included in the display device according to another exemplary, and FIG. 23 is a cross-sectional view taken along line III-III' of FIG. 22. In order to avoid redundancy, differences from the above-described exemplary embodiment will be mainly described. Detailed descriptions of the elements that are substantially the same as those already described above will be omitted to avoid redundancy s.

Referring to FIG. 22, $k^{th}$ and $k+1^{th}$ pixels PXL_K and PXL_K+1 are arranged in the $i^{th}$ pixel row arranged in the display region of FIG. 22, and three scan lines Si−1, Sia and Sib, one emission control line Ei, two data lines Dj and Dj+1, two power supply lines PL1 and PL2, and one initialization power supply line IPL, which are connected to the $k^{th}$ and $k+1^{th}$ pixels PXL_K and PXL_K+1 are disposed.

Each of the $k^{th}$ and $k+1^{th}$ pixels PXL_K and PXL_K+1 shown in FIGS. 22 and 23 may have substantially the same or similar configuration as the pixels of FIGS. 5 and 6, except that the semiconductor layers of the fourth and seventh transistors T4 and T7 are disposed in a different layer from the semiconductor layers of the first to third transistors T1 to T3 and the fifth and sixth transistors T5 and T6.

Referring to FIGS. 22 and 23, a display device according to another exemplary embodiment may include a substrate SUB and the $k^{th}$ and $k+1^{th}$ pixels PXL_K and PXL_K+1 provided on the substrate SUB.

Each of the $k^{th}$ and $k+1^{th}$ pixels PXL_K and PXL_K+1 may include a light emitting device (see OLED in FIG. 3) and a pixel circuit (see PC in FIG. 3) for driving the light emitting device OLED. Herein, the pixel circuit PC may include first to seventh transistors T1 to T7, and a storage capacitor Cst.

The fourth transistor T4 and the seventh transistor T7, among the first to seventh transistors T1 to T7, may be set as an N-type thin film transistor including a semiconductor layer doped with an n-type impurity. The other transistors, for example, the first to third transistors T1 to T3, and the fifth and sixth transistors T5 and T6 may be set as a P-type thin film transistor including a semiconductor layer doped with a p-type impurity.

In an exemplary embodiment, the semiconductor layer doped with the p-type impurity and the semiconductor layer doped with the n-type impurity may be disposed in different layers from each other. For example, the semiconductor layer doped with the n-type impurity may be provided on the semiconductor layer doped with the p-type impurity, or vice versa, but the inventive concepts are not limited thereto.

The semiconductor layer included in each of the first to third transistors T1 to T3 and the fifth and sixth transistors T5 and T6, which are set to the P-type thin film transistor, may be disposed on a different layer from the semiconductor layer included in each of the fourth and seventh transistors T4.

Herein, the semiconductor layer may include an active pattern, and source and drain electrodes connected to the active pattern, respectively.

Each of the $k^{th}$ and $k+1^{th}$ pixels PXL_K and PXL_K+1 may include first and second contact portions CNP1 and CNP2, to which different types of thin film transistors are in contact thereto.

The first contact portion CNP1 may be disposed between the third-b transistor T3b formed of the P-type thin film transistor and the fourth-b transistor T4b formed of the N-type thin film transistor.

More particularly, the first contact portion CNP1 may refer to a region where the third-b drain electrode DE3b of the third-b transistor T3b doped with the p-type impurity and the fourth-b source electrode SE4b of the fourth-b transistor T4b doped with the n-type impurity are in contact with each other.

The third-b drain electrode DE3b and the fourth-b source electrode SE4b may be in contact with the first connection line CNL1 at the first contact portion CNP1.

In an exemplary embodiment, the semiconductor layer of the third transistor T3 formed of the P-type thin film transistor and the semiconductor layer of the fourth transistor T4 formed of the N-type thin film transistor may be provided at a different layer from each other. Therefore, the third-b drain electrode DE3b and the fourth-b source electrode SE4b may be provided at a different layer from each other.

More specifically, the fourth-b source electrode SE4b may be provided on the third-b drain electrode DE3b with a buffer layer BFL interposed therebetween. Herein, the buffer layer BFL may be provided on the substrate SUB to provide a flat surface (or planarize) on the substrate SUB and to prevent penetration of impurities.

The third-b drain electrode DE3b may be connected to one side of the first connection line CNL1 through a second-1 contact hole CH2_1 sequentially passing through the first interlayer insulation layer ILD1, the second gate insulation layer GI2, the first gate insulation layer GI1, and the buffer layer BFL.

The fourth-b source electrode SE4b may be connected to the other side of the first connection line CNL1 through a second-2 contact hole CH2_2 sequentially passing through the first interlayer insulation layer ILD1, the second gate insulation layer GI2, and the first gate insulation layer GI1. As a result, the third-b drain electrode DE3b may be connected to the fourth-b source electrode SE4b through the second-1 and second-2 contact holes CH2_1 and CH2_2 and the first connection line CNL1.

The second contact portion CNP2 may be disposed between the sixth transistor T6 formed of the P-type thin film transistor and the seventh transistor T7 formed of the N-type thin film transistor. More particularly, the second contact portion CNP2 may refer to a region where the sixth drain electrode DE6 of the sixth transistor T6 doped with the p-type impurity and the seventh source electrode SE7 of the seventh transistor T7 doped with the n-type impurity are in contact with each other.

The sixth drain electrode DE6 and the seventh source electrode SE7 may be in contact with the second connection line CNL2 at the second contact portion CNP2.

In an exemplary embodiment, the semiconductor layer of the sixth transistor T6 formed of the P-type thin film transistor and the semiconductor layer of the seventh transistor T7 formed of the N-type thin film transistor may be provided at a different layer from each other. Therefore, the sixth drain electrode DE6 and the seventh source electrode SE7 may be provided at a different layer from each other. More specifically, the seventh source electrode SE7 may be provided on the sixth drain electrode DE6 with the buffer layer BFL interposed therebetween.

The sixth drain electrode DE6 may be connected to one side of the second connection line CNL2 through a seventh-2 contact hole CH7_2 sequentially passing through the first interlayer insulation layer ILD1, the second gate insulation layer GI2, the first gate insulation layer GI1, and the buffer layer BFL.

The seventh source electrode SE7 may be connected to the other side of the second connection line CNL2 through the seventh-1 contact hole CH7_1 sequentially passing through the first interlayer insulation layer ILD1, the second gate insulation layer GI2, and the first gate insulation layer GI1. As a result, the sixth drain electrode DE6 may be connected to the seventh source electrode SE7 through the seventh-1 and seventh-2 contact holes CH7_1 and CH7_2 and the second connection line CNL2.

A display device according to an exemplary embodiment may be applied to various electronic devices. For example, the display device may be applied to a television, a notebook, a mobile phone, a smart phone, a smart pad, a PMP, a PDA, a navigation device, various wearable devices such as a smart watch, and the like.

According to an exemplary embodiment, a pixel of a display device may have reduced defects.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A pixel comprising:
   a light emitting element;
   a first transistor connected between a first node and the light emitting element, the first transistor configured to control an amount of current flowing from a first power supply of the first node to a second power supply via the light emitting element;

a second transistor connected between a data line and the first transistor, the second transistor configured to be turned on by an $i^{th}$ first scan signal, wherein i is a natural number of 2 or more;

a third transistor connected between the first transistor and the first node, the third transistor configured to be turned on by the $i^{th}$ first scan signal and comprising a P-type thin film transistor;

a fourth transistor connected between the first node and an initialization power supply line to which an initialization power supply is supplied, the fourth transistor configured to be turned on by an $i-1^{th}$ scan signal and comprising an N-type thin film transistor; and a first connection line connected between the third transistor and the fourth transistor, the first connection line configured to electrically connect a semiconductor pattern of the third transistor and a semiconductor pattern of the fourth transistor, wherein the first connection line is disposed on the third transistor and the fourth transistor with an insulation layer interposed therebetween, and contacts the semiconductor pattern of each of the third transistor and the fourth transistor through a first contact hole passing through the insulation layer.

2. The pixel of claim 1, wherein:
the semiconductor pattern of the third transistor is doped with a p-type impurity; and
the semiconductor pattern of the fourth transistor is doped with an n-type impurity.

3. The pixel of claim 2, wherein the semiconductor pattern of the third transistor and the semiconductor pattern of the fourth transistor are disposed on the same layer of a substrate and are adjacent to each other.

4. The pixel of claim 3, wherein:
the substrate includes an overlap region where the semiconductor pattern of the third transistor and the semiconductor pattern of the fourth transistor overlap with each other; and
the first connection line contacts the semiconductor pattern of the third transistor, the semiconductor pattern of the fourth transistor, and the overlap region.

5. The pixel of claim 3, wherein:
the substrate includes an undoped region, to which the p-type impurity and the n-type impurity are not doped, and disposed between the semiconductor pattern of the third transistor and the semiconductor pattern of the fourth transistor; and
the first connection line contacts each of the semiconductor pattern of the third transistor and the semiconductor pattern of the fourth transistor with the undoped region interposed therebetween.

6. The pixel of claim 3, further comprising a fifth transistor connected between the initialization power supply line and an anode electrode of the light emitting element, the fifth transistor configured to be turned on by an $i^{th}$ second scan signal and comprising an N-type thin film transistor.

7. The pixel of claim 6, wherein the $i^{th}$ first scan signal and the $i^{th}$ second scan signal have different levels from each other and are simultaneously supplied to a corresponding transistor to activate the corresponding transistor.

8. The pixel of claim 6, further comprising:
a sixth transistor connected between a second electrode of the first transistor and the anode electrode of the light emitting element, the sixth transistor configured to be turned off when an emission control signal is supplied to an emission control line; and
a seventh transistor connected between the first node and the first power supply and configured to be turned off when the emission control signal is supplied,
wherein the sixth transistor and the seventh transistor comprise a P-type thin film transistor.

9. The pixel of claim 8, further comprising a second connection line connected between the fifth transistor and the sixth transistor and configured to electrically connect a semiconductor pattern of the fifth transistor and a semiconductor pattern of the sixth transistor,
wherein the second connection line is disposed on the fifth transistor and the sixth transistor with the insulation layer interposed therebetween, and contacts the semiconductor pattern of each of the fifth transistor and the sixth transistor through a second contact hole passing through the insulation layer.

10. The pixel of claim 9, wherein:
the semiconductor pattern of the fifth transistor is doped with an n-type impurity; and
the semiconductor pattern of the sixth transistor is doped with a p-type impurity.

11. The pixel of claim 10, wherein the semiconductor pattern of the fifth transistor and the semiconductor pattern of the sixth transistor are disposed on the same layer of a substrate and are adjacent to each other.

12. The pixel of claim 8, wherein the first transistor and the second transistor comprise a P-type thin film transistor.

13. A pixel comprising:
a light emitting element;
a first transistor connected between a first node and the light emitting element, the first transistor configured to control an amount of current flowing from a first power supply of the first node to a second power supply via the light emitting element;
a second transistor connected between a data line and the first transistor, the second transistor configured to be turned on by an $i^{th}$ first scan signal, wherein i is a natural number of 2 or more;
a third transistor connected between the first transistor and the first node, the third transistor configured to be turned on by the $i^{th}$ first scan signal;
a fourth transistor connected between the first node and an initialization power supply line to which an initialization power supply is supplied, the fourth transistor configured to be turned on by an $i-1^{th}$ scan signal;
a fifth transistor connected between the first node and the first power supply, the fifth transistor configured to be turned off when an emission control signal is supplied to an emission control line;
a sixth transistor connected between a second electrode of the first transistor and an anode electrode of the light emitting element, the sixth transistor configured to be turned off when the emission control signal is supplied;
a seventh transistor connected between the initialization power supply line and the anode electrode of the light emitting element, the seventh transistor configured to be turned on by an $i^{th}$ second scan signal;
a first connection line connected between the third transistor and the fourth transistor, the first connection line configured to electrically connect a semiconductor pattern of the third transistor and a semiconductor pattern of the fourth transistor; and
a second connection line connected between the sixth transistor and the seventh transistor, the second connection line configured to electrically connect a semiconductor pattern of the sixth transistor and a semiconductor pattern of the seventh transistor,
wherein the fourth transistor and the seventh transistor comprise an N-type thin film transistor, and the first, second, third, fifth, sixth transistors comprise a P-type thin film transistor.

14. The pixel of claim 13, wherein:
the first connection line is disposed on the third transistor and the fourth transistor with an insulation layer interposed therebetween, and contacts the semiconductor pattern of each of the third transistor and the fourth transistor through a first contact hole passing through the insulation layer, and
the second connection line is disposed on the sixth transistor and the seventh transistor with the insulation layer interposed therebetween, and contacts the semiconductor pattern of each of the sixth transistor and the seventh transistor through a second contact hole passing through the insulation layer.

15. The pixel of claim 13, wherein:
the semiconductor pattern of the fourth transistor and the semiconductor pattern of the seventh transistor are doped with an n-type impurity; and
the semiconductor patterns of the first, second, third, fifth, and sixth transistors are doped with a p-type impurity.

16. The pixel of claim 15, wherein:
the semiconductor pattern of the third transistor and the semiconductor pattern of the fourth transistor are disposed on the same layer of a substrate and are adjacent to each other; and
the semiconductor pattern of the sixth transistor and the semiconductor pattern of the seventh transistor are disposed on the same layer of the substrate and are adjacent to each other.

17. The pixel of claim 16, wherein:
the substrate includes an overlap region where the semiconductor pattern of the third transistor and the semiconductor pattern of the fourth transistor overlap with each other; and
the first connection line contacts the semiconductor pattern of the third transistor, the semiconductor pattern of the fourth transistor, and the overlap region.

18. The pixel of claim 16, wherein:
the substrate includes an undoped region, to which the p-type impurity and the n-type impurity are not doped, and disposed between the semiconductor pattern of the third transistor and the semiconductor pattern of the fourth transistor; and
the first connection line contacts each of the semiconductor pattern of the third transistor and the semiconductor pattern of the fourth transistor with the undoped region interposed therebetween.

19. A display device comprising:
a substrate;
a plurality of pixels disposed on the substrate and connected to a plurality of scan lines, a plurality of emission control lines, and a plurality of data lines; and
a driver configured to drive the scan lines, the emission control lines, and the data lines,
wherein at least one pixel disposed in an $i^{th}$ (i is a natural number of 2 or more) horizontal line of the pixels comprises:
a light emitting element;
a first transistor connected between a first node and the light emitting element, the first transistor configured to control an amount of current flowing from a first power supply of the first node to a second power supply via the light emitting element;
a second transistor connected between a corresponding data line and the first transistor, the second transistor configured to be turned on by an $i^{th}$ first scan signal;
a third transistor connected between the first transistor and the first node, the third transistor configured to be turned on by the $i^{th}$ first scan signal and comprises a P-type thin film transistor;
a fourth transistor connected between the first node and an initialization power supply line to which an initialization power supply is supplied, the fourth transistor configured to be turned on by an $i-1^{th}$ scan signal and comprises an N-type thin film transistor; and
a first connection line connected between the third transistor and the fourth transistor, the first connection line configured to electrically connect a semiconductor pattern of the third transistor and a semiconductor pattern of the fourth transistor, and
wherein the first connection line is disposed on the third transistor and the fourth transistor with an insulation layer on the substrate interposed therebetween, and contacts the semiconductor pattern of each of the third transistor and the fourth transistor through a first contact hole passing through the insulation layer.

20. The display device of claim 19, wherein:
the semiconductor pattern of the third transistor is doped with a p-type impurity; and
the semiconductor pattern of the fourth transistor is doped with an n-type impurity.

21. The display device of claim 20, wherein the semiconductor pattern of the third transistor and the semiconductor pattern of the fourth transistor are disposed on the same layer of a substrate and are adjacent to each other.

22. The display device of claim 21, wherein:
the substrate includes an overlap region where the semiconductor pattern of the third transistor and the semiconductor pattern of the fourth transistor overlap with each other; and
the first connection line contacts the semiconductor pattern of the third transistor, the semiconductor pattern of the fourth transistor, and the overlap region.

23. The display device of claim 21, wherein:
the substrate includes an undoped region, to which the p-type impurity and the n-type impurity are not doped, and disposed between the semiconductor pattern of the third transistor and the semiconductor pattern of the fourth transistor; and
the first connection line contacts each of the semiconductor pattern of the third transistor and the semiconductor pattern of the fourth transistor with the undoped region interposed therebetween.

24. The display device of claim 21, further comprising a fifth transistor connected between the initialization power supply line and an anode electrode of the light emitting element, the fifth transistor configured to be turned on by an $i^{th}$ second scan signal and comprising an N-type thin film transistor.

25. The display device of claim 24, wherein the $i^{th}$ first scan signal and the $i^{th}$ second scan signal have different levels from each other, and are simultaneously supplied to a corresponding transistor to activate the corresponding transistor.

26. The display device of claim 24, further comprising:
a sixth transistor connected between a second electrode of the first transistor and the anode electrode of the light emitting element, the sixth transistor configured to be turned off when an emission control signal is supplied to an corresponding emission control line; and a seventh transistor connected between the first node and the first power supply, the seventh transistor configured to be turned off when the emission control signal is supplied, wherein the sixth transistor and the seventh transistor comprise a P-type thin film transistor.

27. The display device of claim 26, further comprising a second connection line connected between the fifth transistor and the sixth transistor, the second connection line configured to electrically connect a semiconductor pattern of the fifth transistor and a semiconductor pattern of the sixth transistor, wherein the second connection line is disposed on the fifth transistor and the sixth transistor with the insulation layer interposed therebetween, and contacts the semiconductor pattern of each of the fifth transistor and the sixth transistor through a second contact hole passing through the insulation layer.

28. The display device of claim 27, wherein:
the semiconductor pattern of the fifth transistor is doped with a n-type impurity; and
the semiconductor pattern of the sixth transistor is doped with an p-type impurity.

29. The display device of claim 28, wherein the semiconductor pattern of the fifth transistor and the semiconductor pattern of the sixth transistor are disposed on the same layer of a substrate, and are adjacent to each other.

30. The display device of claim 26, wherein the first transistor and the second transistor comprise a P-type thin film transistor.

* * * * *